United States Patent
Sharma et al.

(10) Patent No.: US 12,412,835 B2
(45) Date of Patent: Sep. 9, 2025

(54) BACK-SIDE POWER DELIVERY WITH GLASS SUPPORT AT THE FRONT

(71) Applicant: Intel Corporation, Santa Clara, CA (US)

(72) Inventors: Abhishek A. Sharma, Hillsboro, OR (US); Wilfred Gomes, Portland, OR (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 882 days.

(21) Appl. No.: 17/241,374

(22) Filed: Apr. 27, 2021

(65) Prior Publication Data

US 2022/0344262 A1 Oct. 27, 2022

(51) Int. Cl.
| | |
|---|---|
| *H01L 23/528* | (2006.01) |
| *H01L 21/768* | (2006.01) |
| *H01L 23/15* | (2006.01) |
| *H01L 25/16* | (2023.01) |

(52) U.S. Cl.
CPC ........ *H01L 23/5286* (2013.01); *H01L 21/768* (2013.01); *H01L 23/15* (2013.01); *H01L 25/16* (2013.01)

(58) Field of Classification Search
CPC ... H01L 23/5286; H01L 21/768; H01L 23/15; H01L 25/16; H01L 2224/08058; H01L 2224/08121; H01L 2224/08123; H01L 2224/08145; H01L 2224/80896;
(Continued)

(56) References Cited

U.S. PATENT DOCUMENTS

| | | |
|---|---|---|
| 7,092,288 B2 | 8/2006 | Lojek |
| 7,701,751 B2 | 4/2010 | Kang et al. |
| 7,804,702 B2 | 9/2010 | Madan |

(Continued)

FOREIGN PATENT DOCUMENTS

| | | |
|---|---|---|
| DE | 10047963 A1 | 3/2001 |
| EP | 3534401 A2 | 9/2019 |

(Continued)

OTHER PUBLICATIONS

Anil, D.G., et al., "Performance Evaluation of Ternary Computation in SRAM Design Using Graphene Nanoribbon Field Effect Transistors," IEEE 8th Annual Computing and Communication Workshop and Conference (CCWC), Las Vegas, NV, pp. 382-388 (2018).

(Continued)

*Primary Examiner* — Ratisha Mehta
*Assistant Examiner* — Sophia W Kao
(74) *Attorney, Agent, or Firm* — Akona IP PC

(57) ABSTRACT

Embodiments of the present disclosure are based on using transistors with back-side contacts. Such transistors enable back-side power delivery to IC components (e.g., transistors, etc.) of an IC structure, which may be more advantageous than front-side power delivery in some implementations. Embodiments of the present disclosure are further based on recognition that using a glass support structure at the front side of an IC structure with back-side power delivery may advantageously reduce parasitic effects in the IC structure, e.g., compared to using a silicon-based support structure at the front.

20 Claims, 13 Drawing Sheets

(58) Field of Classification Search
CPC ....... H01L 23/522; H01L 24/08; H01L 24/80; H01L 2224/80895

See application file for complete search history.

(56) References Cited

U.S. PATENT DOCUMENTS

| | | | |
|---|---|---|---|
| 8,178,862 B2 | 5/2012 | Colinge | |
| 8,841,777 B2 | 9/2014 | Farooq et al. | |
| 9,431,368 B2 | 8/2016 | Enquist et al. | |
| 9,640,509 B1 | 5/2017 | Yang | |
| 11,239,238 B2 | 2/2022 | Gomes et al. | |
| 11,737,288 B2* | 8/2023 | Ho | H10B 61/22 |
| | | | 257/5 |
| 11,749,729 B2* | 9/2023 | Chen | H01L 21/823418 |
| | | | 257/288 |
| 2002/0036313 A1 | 3/2002 | Yang et al. | |
| 2004/0000722 A1 | 1/2004 | Powers | |
| 2005/0230682 A1 | 10/2005 | Hara | |
| 2006/0084204 A1 | 4/2006 | Mn et al. | |
| 2006/0118777 A1 | 6/2006 | Hirakata et al. | |
| 2009/0030801 A1 | 1/2009 | Meggs | |
| 2009/0108457 A1 | 4/2009 | Christensen et al. | |
| 2009/0111214 A1 | 4/2009 | Christensen et al. | |
| 2009/0142888 A1 | 6/2009 | Tsuchiya | |
| 2010/0295102 A1 | 11/2010 | Sankin et al. | |
| 2011/0073998 A1 | 3/2011 | Lin | |
| 2012/0032236 A1 | 2/2012 | Yamazaki et al. | |
| 2012/0248621 A1 | 10/2012 | Sadaka | |
| 2013/0140680 A1 | 6/2013 | Harada et al. | |
| 2014/0001604 A1 | 1/2014 | Sadaka | |
| 2014/0239458 A1 | 8/2014 | Farooq et al. | |
| 2015/0021771 A1 | 1/2015 | Lin | |
| 2015/0035568 A1 | 2/2015 | Peng et al. | |
| 2015/0162185 A1 | 6/2015 | Pore | |
| 2015/0162336 A1 | 6/2015 | Kim et al. | |
| 2015/0228551 A1 | 8/2015 | Oi et al. | |
| 2015/0250058 A1* | 9/2015 | Ramachandran | H01L 25/065 |
| | | | 361/748 |
| 2016/0049351 A1 | 2/2016 | McCann | |
| 2016/0197069 A1 | 7/2016 | Morrow et al. | |
| 2016/0318757 A1 | 11/2016 | Chou et al. | |
| 2016/0343762 A1 | 11/2016 | Kagawa et al. | |
| 2017/0025381 A1 | 1/2017 | Tsai et al. | |
| 2017/0110494 A1 | 4/2017 | Tsai et al. | |
| 2017/0162507 A1 | 6/2017 | Das et al. | |
| 2017/0200700 A1 | 7/2017 | Das et al. | |
| 2017/0256480 A1 | 9/2017 | Reingruber et al. | |
| 2017/0287905 A1 | 10/2017 | Morrow et al. | |
| 2018/0181524 A1 | 6/2018 | Schulz et al. | |
| 2018/0323199 A1 | 11/2018 | Roberts et al. | |
| 2019/0058109 A1 | 2/2019 | Chen et al. | |
| 2019/0103406 A1 | 4/2019 | Tang et al. | |
| 2019/0287908 A1 | 9/2019 | Dogiamis et al. | |
| 2019/0305135 A1 | 10/2019 | Radosavljevic et al. | |
| 2019/0326296 A1 | 10/2019 | Wang et al. | |
| 2019/0371891 A1* | 12/2019 | Goktepeli | H01L 21/30625 |
| 2020/0013673 A1 | 1/2020 | Zierath et al. | |
| 2020/0058705 A1 | 2/2020 | Sharma et al. | |
| 2020/0090990 A1 | 3/2020 | Fan et al. | |
| 2020/0091156 A1 | 3/2020 | Sharma et al. | |
| 2020/0091274 A1 | 3/2020 | Sharma et al. | |
| 2020/0098719 A1 | 3/2020 | Park et al. | |
| 2020/0105719 A1 | 4/2020 | Li et al. | |
| 2020/0105751 A1 | 4/2020 | Dewey et al. | |
| 2020/0105892 A1 | 4/2020 | Haratipour et al. | |
| 2020/0111918 A1 | 4/2020 | Karda et al. | |
| 2020/0127142 A1 | 4/2020 | Dewey et al. | |
| 2020/0203329 A1 | 6/2020 | Kanamori et al. | |
| 2020/0273751 A1 | 8/2020 | Dasgupta et al. | |
| 2020/0303301 A1 | 9/2020 | Chen et al. | |
| 2020/0303361 A1 | 9/2020 | Shih | |
| 2020/0312817 A1 | 10/2020 | Wu et al. | |
| 2020/0365514 A1 | 11/2020 | Yang et al. | |
| 2020/0381512 A1 | 12/2020 | Kao et al. | |
| 2020/0411078 A1 | 12/2020 | Sharma et al. | |
| 2020/0411524 A1 | 12/2020 | Arslan et al. | |
| 2021/0020596 A1 | 1/2021 | Yi et al. | |
| 2021/0057309 A1* | 2/2021 | Hu | H01L 23/5283 |
| 2021/0074709 A1 | 3/2021 | Liu | |
| 2021/0098062 A1 | 4/2021 | Kwon | |
| 2021/0366855 A1 | 11/2021 | Okina | |
| 2021/0391324 A1 | 12/2021 | Lu et al. | |
| 2022/0139771 A1 | 5/2022 | Chang | |
| 2022/0181285 A1 | 6/2022 | Hong et al. | |
| 2022/0285240 A1 | 9/2022 | Huang et al. | |
| 2022/0293513 A1* | 9/2022 | Li | H02J 50/05 |
| 2022/0320299 A1* | 10/2022 | Chen | H10D 88/01 |
| 2022/0344320 A1 | 10/2022 | Juengling | |

FOREIGN PATENT DOCUMENTS

| | | |
|---|---|---|
| WO | 2014051977 A1 | 4/2014 |
| WO | 2016025451 A1 | 2/2016 |
| WO | 2018208719 A1 | 11/2018 |

OTHER PUBLICATIONS

Barroso, Luiz A., "Impact of Chip-Level Integration on Performance of OLTP Workloads," Sixth International Symposium on High-Performance Computer Architecture (HPCA), Jan. 2000, 12 pages.

Extended European Search Report from European Application No. 20191821.6 dated Feb. 2, 2021, 9 pages.

Fujun B. et al., "A Stacked Embedded DRAM Array for LPDDR4/4X using Hybrid Bonding 3D Integration with 34GB/s/1Gb 0.88 pJ/b Logic-to-Memory Interface," 2020 IEEE International Electron Devices Meeting (IEDM) Dec. 12, 2020 (pp. 6-6); 4 pages.

Hsieh, E.R., et al., "A Novel Architecture to Build Ideal-linearity Neuromorphic Synapses on a Pure Logic FinFET Platform Featuring 2.5ns PGM-time and 1012 Endurance," 2019 Symposium on VLSI Technology Digest of Technical Papers; 2 pages.

Joshi, S., et al., "Graphene Nanoribbon Field Effect Transistor Based Ultra-Low Energy SRAM Design," IEEE International Symposium on Nanoelectronic and Information Systems (iNIS), Gwalior, pp. 76-79 (2016).

Khasanvis, S., et al., "Low-Power Heterogeneous Graphene Nanoribbon-CMOS Multistate Volatile Memory Circuit," 17 pages.

Non Final Office Action of U.S. Appl. No. 16/669,599 dated Jan. 11, 2021, 9 pages.

Non Final Office Action of U.S. Appl. No. 16/806,283 dated Jan. 7, 2021, 7 pages.

Notice of Allowance in U.S. Appl. No. 16/724,691 dated Jan. 13, 2021, 9 pages.

Partial European Search Report from European Application No. 20181563.6 dated Jan. 21, 2021, 13 pages.

Rabieefar, et al., "Utilizing Graphene Nano-Ribbon Transistor in Data Converters: A Comparative Study," ECS Journal of Solid State Science and Technology, 8; M30-M37 (2019).

Sinha, Saurabh, et al., "Stack up your chips: Betting on 3D integration to augment Moores Law scaling, " IEEE Smart City Summit (SCS) Conference, Nov. 1, 2019, San Jose, CA; 5 pages.

Trombini, H., et al., "Unraveling structural and compositional information in 3D FinFET electronic devices," Nature.com/Scientific Reports; 7 pages (Aug. 12, 2019).

Xu, C., et al., "Modeling, Analysis, and Design of Graphene Nano-Ribbon Interconnects," IEEE Transaction on Electron Devices; vol. 56, No. 8; pp. 1567-1578 (Aug. 2009).

Non Final Office Action in U.S. Appl. No. 16/669,599 dated Jul. 13, 2021, 10 pages.

Non Final Office Action in U.S. Appl. No. 16/667,740 dated Jun. 21, 2021, 10 pages.

Extended European Search Report in European Patent Application No. 22162574.2 dated Sep. 15, 2022, 7 pages.

Extended European Search Report in European Patent Application No. 22174054.1 dated Nov. 15, 2022, 7 pages.

Mikolajick, T. et al."Next generation ferroelectric materials for semiconductor process integration and their applications," J. Appl. Phys. 129, 100901-1 through 100901-21 (2021).

(56) References Cited

OTHER PUBLICATIONS

PloBl, Andreas et al."Silicon-on-insulator: materials aspects and applications," Solid-State Electronics 44 (2000, 775-782.

* cited by examiner

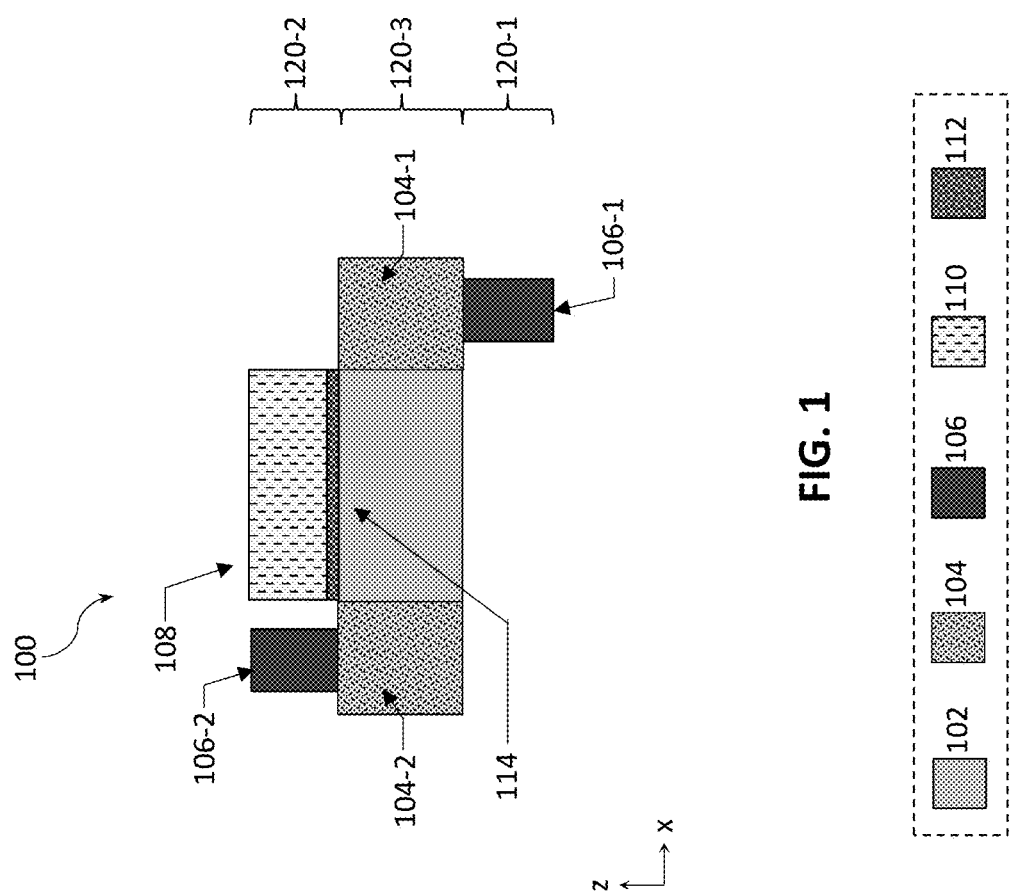

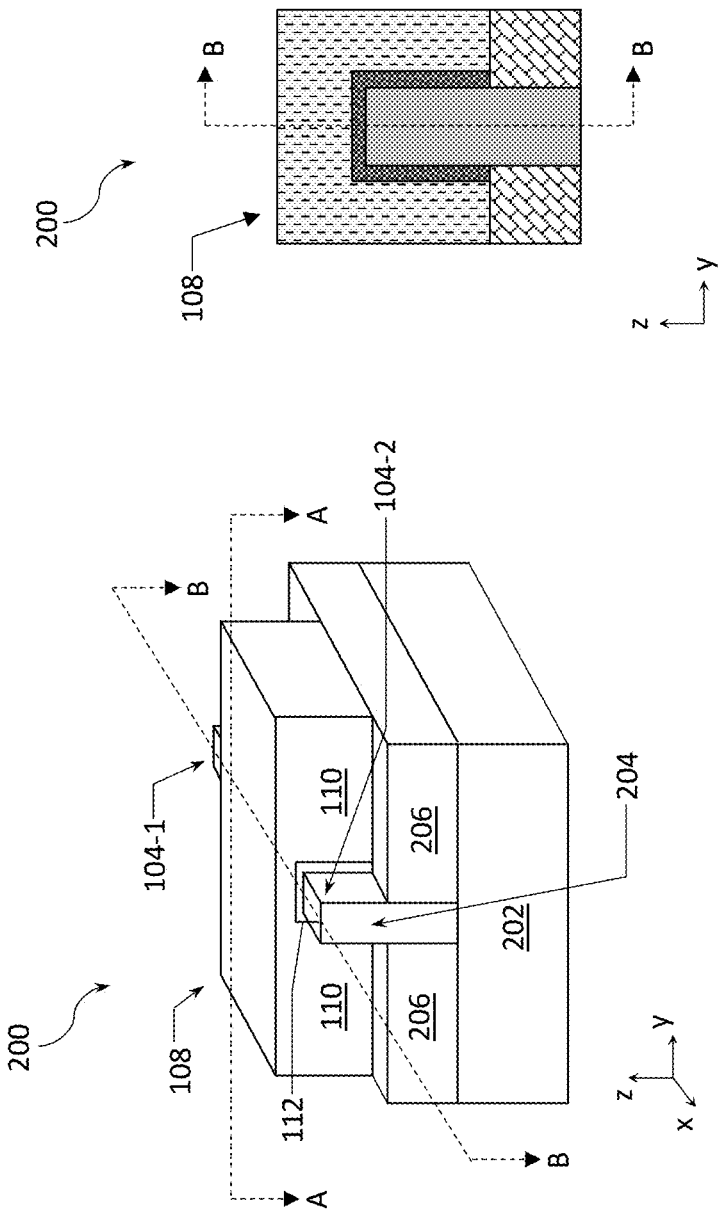
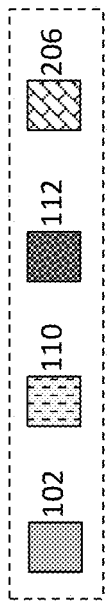
FIG. 2B
FIG. 2A

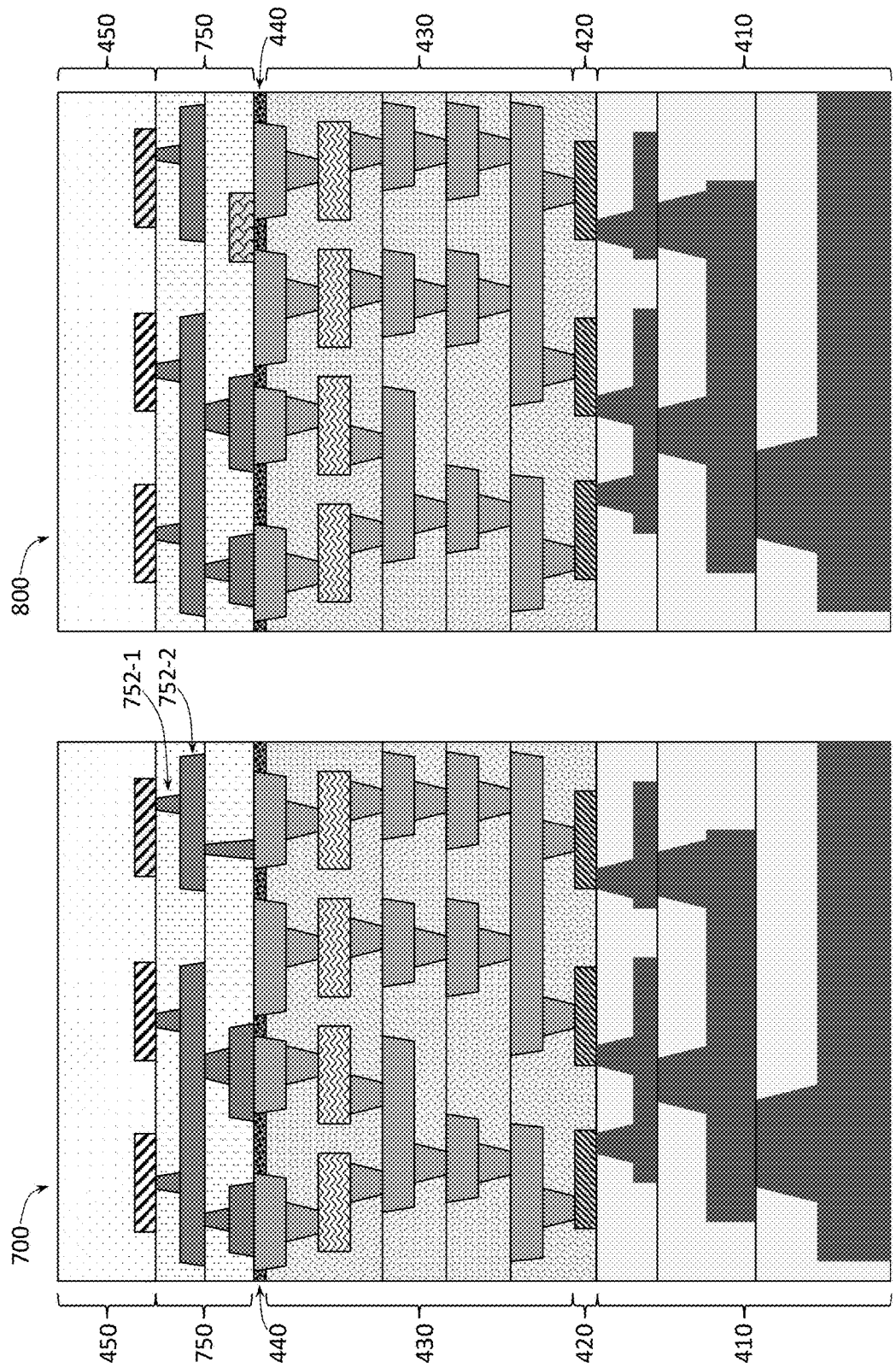
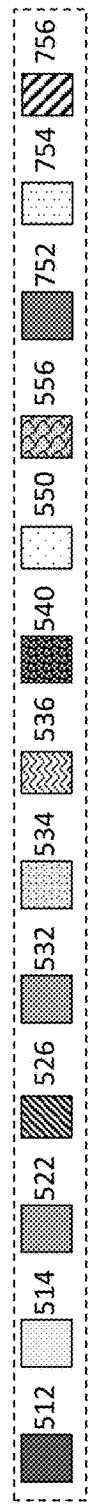
FIG. 7
FIG. 8

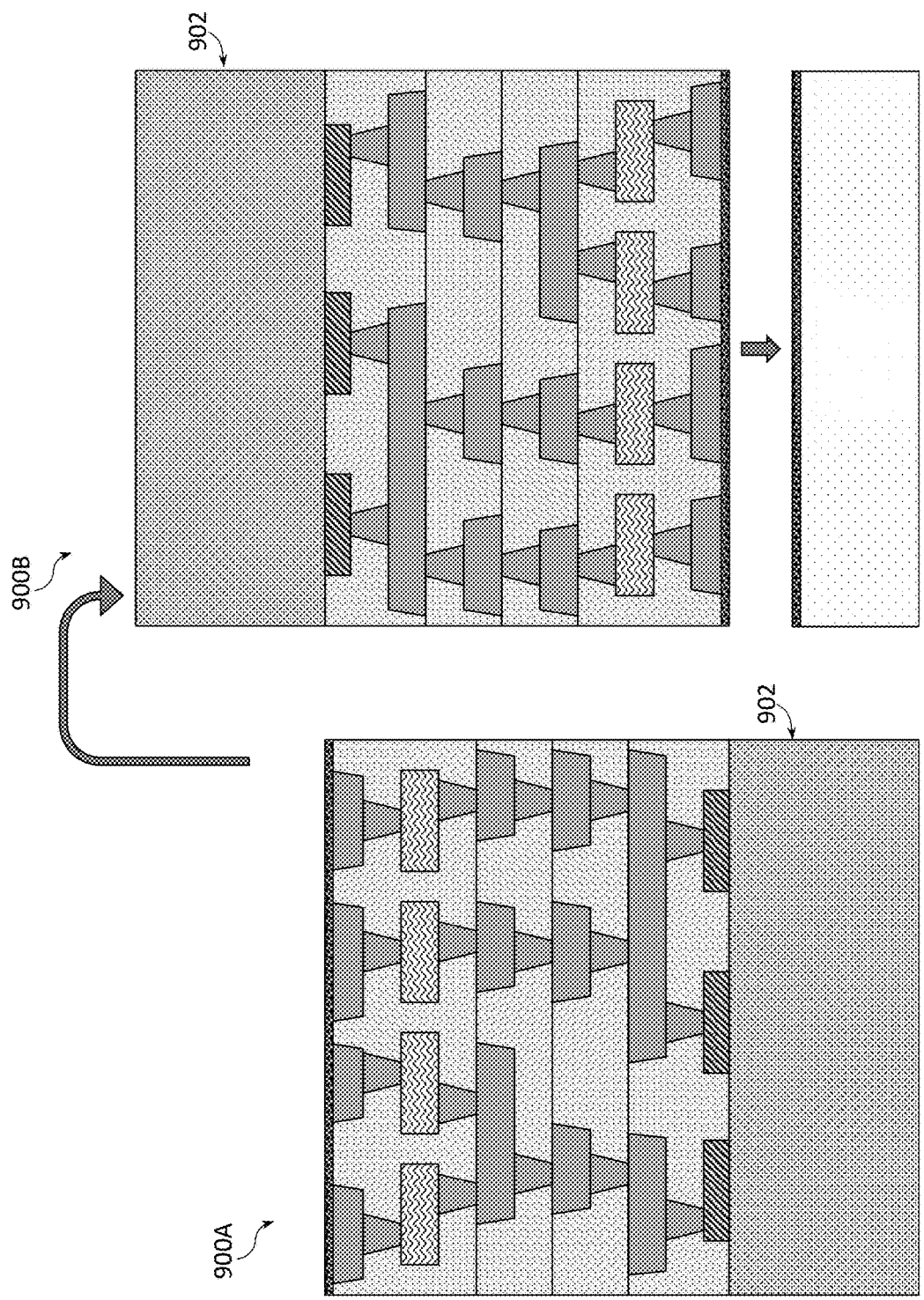

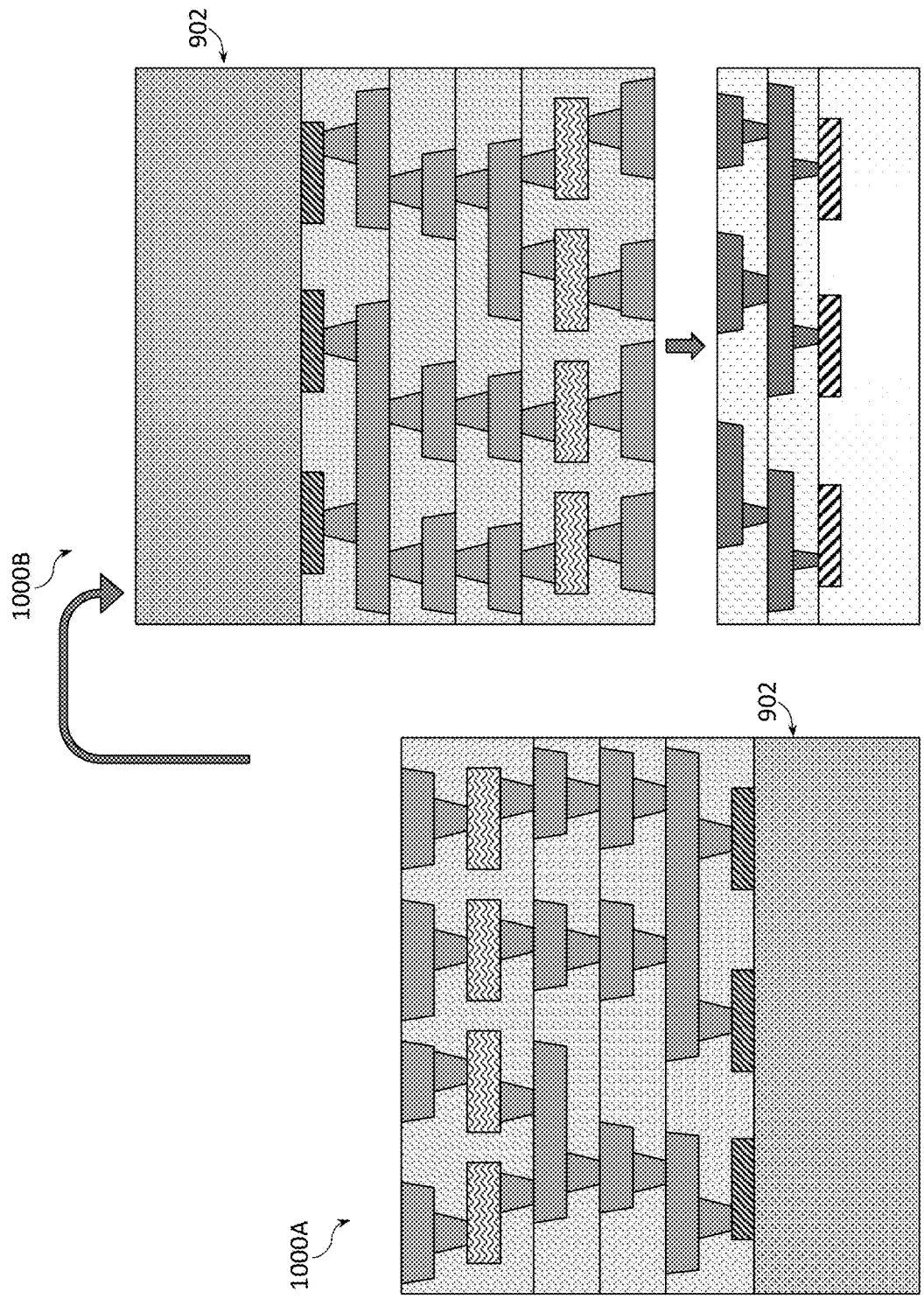

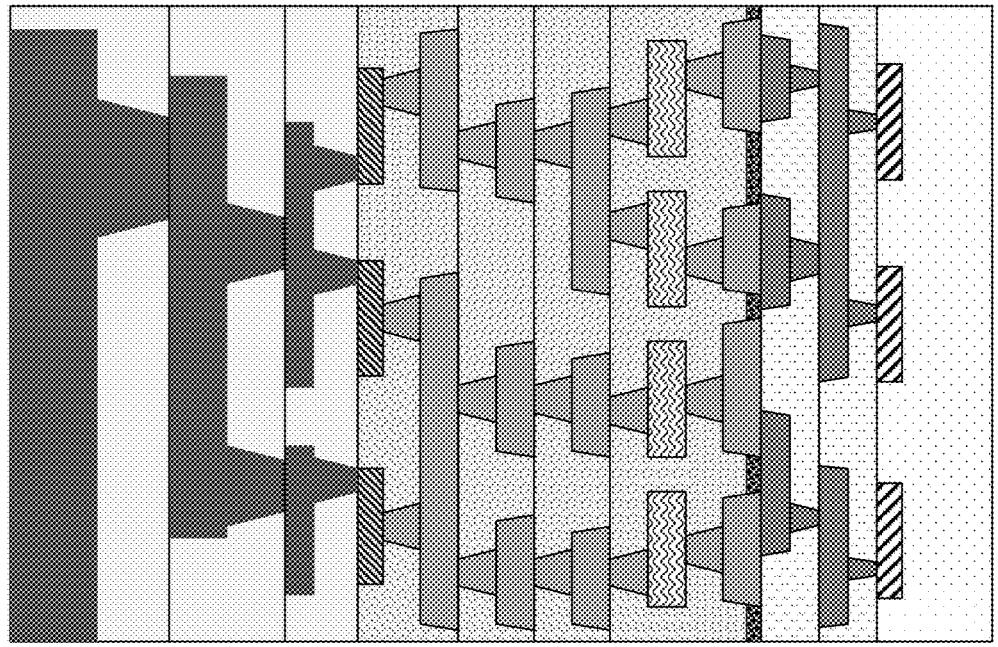
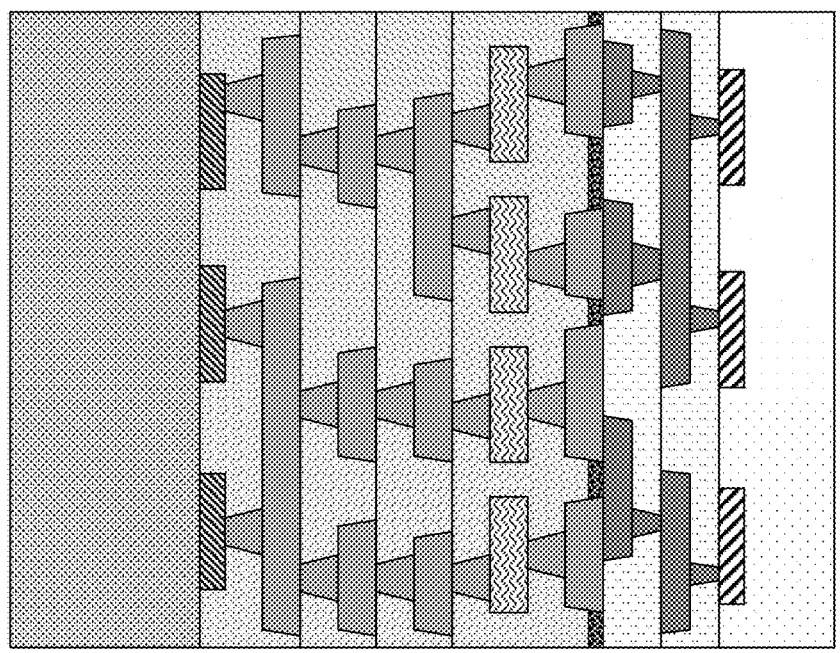
FIG. 10D
FIG. 10C

BACK-SIDE POWER DELIVERY WITH GLASS SUPPORT AT THE FRONT

BACKGROUND

For the past several decades, the scaling of features in integrated circuits has been a driving force behind an ever-growing semiconductor industry. Scaling to smaller and smaller features enables increased densities of functional units on the limited real-estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 provides a schematic illustration of a cross-sectional view of an example transistor with a back-side contact according to some embodiments of the present disclosure.

FIGS. 2A-2B are perspective and cross-sectional views, respectively, of an example transistor with a back-side contact implemented as a FinFET, according to some embodiments of the present disclosure.

FIGS. 5-8 provide schematic illustrations of an IC assembly with back-side power delivery and glass support at the front, according to various embodiments of the present disclosure.

FIGS. 9A-9D illustrate a first example method of forming an IC assembly with back-side power delivery and glass support at the front, according to some embodiments of the present disclosure.

FIGS. 10A-10D illustrate a second example method of forming an IC assembly with back-side power delivery and glass support at the front, according to some embodiments of the present disclosure.

DETAILED DESCRIPTION

Overview

Figure 3:
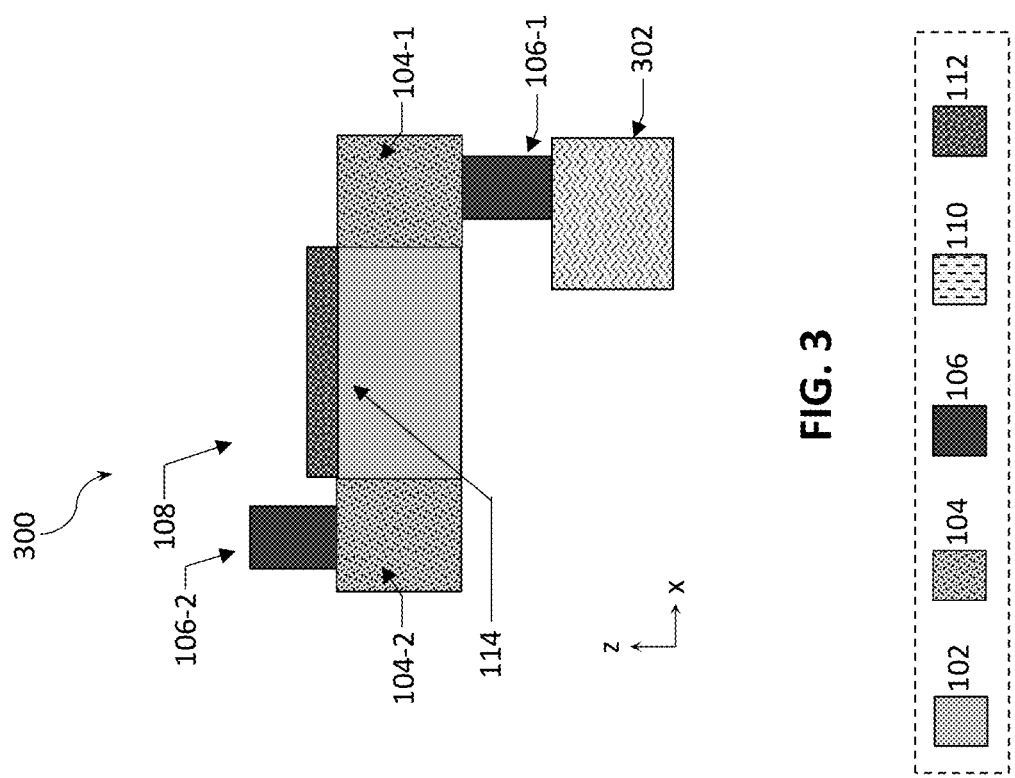
FIG. 3 provides a schematic illustration of a cross-sectional view of an example memory cell that includes a transistor with a back-side contact, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC assemblies with back-side power delivery and glass support at the front as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

Monolithic ICs generally include a number of transistors, such as metal oxide semiconductor (MOS) field-effect transistors (FETs) (MOSFETs), fabricated over a planar substrate, such as a silicon wafer. While Moore's Law has held true for decades within the IC industry, lateral scaling of IC dimensions is becoming more difficult with MOSFET gate dimensions now below 20 nanometers. As device sizes continue to decrease, there will come a point where it becomes impractical to continue standard planar scaling. This inflection point could be due to economics or physics, such as prohibitively high capacitance, or quantum-based variability. Stacking of transistors in a third dimension, typically referred to as vertical scaling, or three-dimensional (3D) integration, is therefore a promising path toward greater transistor density.

While 3D integration may be achieved at a package level, for example by stacking separately manufactured chips, a monolithic 3D approach offers the greatest inter-layer interconnect density, allowing 3D circuits, such as 3D logic circuits, to be constructed at the lowest level and the tightest circuit density. Realizing a monolithic 3D IC architecture with favorable metrics in terms of power, performance, and footprint area is not a trivial task and further improvements are always desirable.

Embodiments of the present disclosure are based on using transistors with back-side contacts. Conventional front end of line (FEOL) transistors have both source and drain contacts on one side of the transistor, usually on the side facing away from the substrate. In contrast to the approaches of building logic and memory devices with such conventional FEOL transistors, various embodiments of the present disclosure provide transistors, various IC devices incorporating such transistors (e.g., logic devices, memory cells and arrays, etc.), as well as associated methods and larger devices, in which a transistor has at least one source or drain (S/D) contact on one side and another S/D contact on the other side. One side of a transistor may be referred to as a "front side" while the other side may be referred to as a "back side," where, in general, in the context of the present disclosure, a "side" of a transistor refers to a region or a layer either above or below a layer of the channel material of the transistor. Thus, transistors described herein may have one of the S/D contacts on the front side (such contacts referred to as "front-side contacts") and the other one of their S/D contacts on the back side (such contacts referred to as "back-side contacts"). In further embodiments, both S/D contacts of at least some of the transistors used in IC assemblies described herein may be on the back side of the transistor. In the following, transistors having one front-side and one back-side S/D contacts, as well as transistors having two back-side S/D contacts, may be simply referred to as "transistors with back-side contacts."

Using transistors with back-side contacts provides several advantages and enables unique architectures that were not possible with conventional, FEOL logic transistors with both S/D contacts being on one side. One advantage is that such transistors enable back-side power delivery to IC components (e.g., transistors, etc.) of an IC structure, i.e., delivery of power from the back side of the IC structure. Back-side power delivery may be more advantageous than front-side power delivery in some implementations, e.g., in monolithic 3D IC architectures. Another advantage is that such transistors may be moved to the back end of line (BEOL) layers of an advanced complementary metal oxide semiconductor (CMOS) process. Yet another advantage is that implementing at least some of the transistors with their S/D contacts on different sides allows substantial flexibility to making electrical connections to these transistors. Consequently, at least portions of logic devices and memory cells incorporating such transistors may be provided in different layers above the support structure, thus enabling 3D integration of memory and logic devices and, in particular, enabling a stacked architecture with many layers of memory and/or logic devices. Providing 3D memory and/or logic devices allows significantly increasing density of these devices (e.g., density of memory cells in a memory array) having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of a structure with a given density of memory and/logic devices.

When back-side power delivery is implemented, besides interconnects for delivering power, a back-side power delivery structure may be include various IC devices (e.g., capacitors, inductors, resistors, etc.) for reducing the parasitic effects of the assembly, e.g., for reducing parasitic effects associated with the interconnects used for power delivery. However, as more and more IC components are implemented on the front side of an IC structure, the density of power interconnects at the backside increases to the point that it becomes challenging to also implement additional IC devices for reducing the parasitic effects of the assembly.

Embodiments of the present disclosure are based on recognition that using a glass support structure at the front side of an IC structure with back-side power delivery may advantageously reduce parasitic effects in the IC structure, e.g., compared to using a silicon-based (Si) support structure at the front. As used herein, the term "glass support structure" refers to any support structure that has a dielectric constant lower than that of Si, e.g., lower than about 11. Such a glass support structure may include any type of glass materials in some embodiments, since glass has dielectric constants in a range between about 5 and 10.5. However, in some embodiments, what is described herein as a glass support structure may include materials other than glass, e.g., mica, as long as those materials have sufficiently low dielectric constants. Arranging a support structure with a dielectric constant lower than that of Si at the front of an IC structure may advantageously decrease various parasitic effects associated with the IC structure, since they are typically proportional to the dielectric constant of the surrounding medium. Furthermore, arranging such a support structure enables implementing at least some of the additional IC devices for reducing the parasitic effects of the assembly at the front of the IC structure, thus advantageously augmenting the back-side power delivery without crowding the valuable real-estate of the back-side power interconnects.

An example IC assembly includes an FEOL layer with a plurality of FEOL devices, a back-side power delivery structure with a plurality of power interconnects electrically coupled to (e.g., in electrically conductive contact with at least portions of) various ones of the plurality of FEOL devices, a BEOL layer with a plurality of BEOL interconnects electrically coupled to (e.g., in electrically conductive contact with at least portions of) one or more of the plurality of FEOL devices, and a glass support structure (e.g., at least a portion of a glass wafer), where the FEOL layer is between the back-side power delivery structure and the BEOL layer, and the BEOL layer is between the FEOL layer and the glass support structure.

In the context of the present disclosure, the term "above" may refer to being further away from the support structure or the FEOL of an IC device, while the term "below" refers to being closer towards the support structure or the FEOL of the IC device.

In the following, some descriptions may refer to a particular side of the transistor being referred to as a front side and the other side being referred to as a back side to illustrate the general concept of transistors having their S/D contacts on different sides. However, unless specified otherwise, which side of a transistor is considered to be a front side and which side is considered to be a back side is not important. Therefore, descriptions of some illustrative embodiments of the front and back sides provided herein are applicable to embodiments where the designation of front and back sides may be reversed, as long as one of the S/D contacts for a transistor is provided on one side and another one—on the other, with respect to the channel layer. Furthermore, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

While some descriptions provided herein may refer to transistors being top-gated transistors, embodiments of the present disclosure are not limited to only this design and include transistors of various other architectures, or a mixture of different architectures. For example, in various embodiments, transistors with back-side S/D contacts, described herein, may include bottom-gated transistors, top-gated transistors, FinFETs, nanowire transistors, planar transistors, etc., all of which being within the scope of the present disclosure. Furthermore, although descriptions of the present disclosure may refer to logic devices or memory cells provided in a given layer, each layer of the IC devices described herein may also include other types of devices besides logic or memory devices described herein. For example, in some embodiments, IC devices with logic devices incorporating transistors having back-side S/D contacts may also include memory cells in any of the layers.

Furthermore, in the following detailed description, various aspects of the illustrative implementations will be described using terms commonly employed by those skilled in the art to convey the substance of their work to others skilled in the art.

For example, a term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of an IC chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC chip.

In another example, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials. If used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 9A-9D, such a collection may be referred to herein without the letters, e.g., as "FIG. 9."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC assemblies with back-side power delivery and glass support at the front as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Transistor Architectures

FIG. 1 provides a schematic illustration of a cross-sectional view of an example transistor 100, implemented as a FET, with a back-side contact according to some embodiments of the present disclosure.

A number of elements labeled in FIG. 1 and in at least some of the subsequent figures with reference numerals are illustrated in these figures with different patterns, with a legend showing the correspondence between the reference numerals and patterns being provided at the bottom of each drawing page containing these figures. For example, the legend illustrates that FIG. 1 uses different patterns to show a channel material 102, S/D regions 104, contacts 104 to S/D regions, etc. Furthermore, although a certain number of a given element may be illustrated in FIG. 1 and in at least some of the subsequent figures, this is also simply for ease of illustration, and more, or less, than that number may be included in an IC device according to various embodiments of the present disclosure. Still further, various IC device views shown in FIG. 1 and in at least some of the subsequent figures are intended to show relative arrangements of various elements therein, and that various IC devices, or portions thereof, may include other elements or components that are not illustrated (e.g., any further materials, such as spacer materials that may surround the gate stack of the transistor 100, etch-stop materials, etc.).

In general, a FET, e.g., a MOSFET, is a three-terminal device that includes source, drain, and gate terminals and uses electric field to control current flowing through the device. A FET typically includes a channel material, a source region and a drain regions provided in the channel material, and a gate stack that includes a gate electrode material, alternatively referred to as a "work function" (WF) material, provided over a portion of the channel material between the source and the drain regions, and, optionally, also includes a gate dielectric material between the gate electrode material and the channel material. This general structure is shown in FIG. 1, illustrating a channel material 102, S/D regions 104 (shown as a first S/D region 104-1, e.g., a source region, and a second S/D region 104-2, e.g., a drain region), contacts 106 to S/D regions (shown as a first S/D contact 106-1, providing electrical contact to the first S/D region 104-1, and a second S/D contact 106-2, providing electrical contact to the second S/D region 104-2), and a gate stack 108, which includes at least a gate electrode 110 and may also, optionally, include a gate dielectric 112.

Implementations of the present disclosure may be formed or carried out on a support structure, which may be, e.g., a substrate, a die, a wafer or a chip. The substrate may, e.g., be the wafer 2000 of FIG. 11A, discussed below, and may be, or be included in, a die, e.g., the singulated die 2002 of FIG. 11B, discussed below. The substrate may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the substrate may be a printed circuit board (PCB) substrate. Although a few examples of materials from which the substrate may be formed are described here, any material that may serve as a foundation upon which IC assemblies with back-side power delivery and glass support at the front as described herein may be built falls within the spirit and scope of the present disclosure. In various embodiments, the channel material 102 may include, or may be formed upon, any such substrate material that provides a suitable surface for forming the transistor 100.

In some embodiments, the channel material 102 may be composed of semiconductor material systems including, for example, N-type or P-type materials systems. In some embodiments, the channel material 102 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 102 may include a combination of semiconductor materials where one semiconductor material may be used for the channel portion (e.g., a portion 114 shown in FIG. 1, which is supposed to refer to the upper-most portion of the channel material 102) and another material, sometimes referred to as a "blocking material," may be used between the channel portion 114 and the support structure over which the transistor 100 is provided. In some embodiments, the channel material 102 may include a monocrystalline semiconductor, such as silicon (Si) or germanium (Ge). In some embodiments, the channel material 102 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 100 is an N-type metal oxide semiconductor (NMOS)), the channel portion 114 of the channel material 102 may advantageously include a III-V material having a high electron mobility, such as, but not limited to InGaAs, InP, InSb, and InAs. For some such embodiments, the channel portion 114 of the channel material 102 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion 114 of the channel material 102 may be an intrinsic III-V material, i.e., a III-V semiconductor material not intentionally doped with any electrically active impurity. In alternate embodiments, a nominal impurity dopant level may be present within the channel portion 114 of the channel material 102, for example to further fine-tune a threshold voltage Vt, or to provide HALO pocket implants, etc. Even for impurity-doped embodiments however, impurity dopant level within the channel portion 114 of the channel material 102 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 100 is a P-type metal oxide semiconductor (PMOS)), the channel portion 114 of the channel material 102 may advantageously be a group IV material having a high hole mobility, such as, but not limited to Ge or a Ge-rich SiGe alloy. For some example embodiments, the channel portion 114 of the channel material 102 may have a Ge content between 0.6 and 0.9, and advantageously may be at least 0.7. In some embodiments with highest mobility, the channel portion 114 may be intrinsic III-V (or IV for P-type devices) material and not intentionally doped with any electrically active impurity. In alternate embodiments, one or more a nominal impurity dopant level may be present within the channel portion 114, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the transistor 100 may be a thin-film transistor (TFT). A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. If the transistor 100 is a TFT, the channel material 102 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 100 is a TFT, the channel material 102 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 102 may have a thickness between about 5 and 75 nanometers, including all values and ranges therein. In some embodiments, a thin film channel material 102 may be deposited at relatively low temperatures, which allows depositing the channel material 102 within the thermal budgets imposed on back end fabrication to avoid damaging other components, e.g., front end components such as the logic devices.

As shown in FIG. 1, a first and a second S/D regions 104-1, 104-2 (together referred to as "S/D regions 104") may be included on either side of the gate stack 108, thus realizing a transistor. As is known in the art, source and drain regions (also sometimes interchangeably referred to as "diffusion regions") are formed for the gate stack of a FET. In some embodiments, the S/D regions 104 of the transistor 100 may be regions of doped semiconductors, e.g., regions of the channel material 102 (e.g., of the channel portion 114) doped with a suitable dopant to a suitable dopant concentration, so as to supply charge carriers for the transistor channel. In some embodiments, the S/D regions 104 may be highly doped, e.g., with dopant concentrations of about $1 \cdot 10^{21}$ $cm^{-3}$, in order to advantageously form Ohmic contacts with the respective S/D contacts 106, although, in other embodiments, these regions may also have lower dopant concentrations and may form Schottky contacts in some implementations. Irrespective of the exact doping levels, the S/D regions 104 of the transistor 100 may be the regions having dopant concentration higher than in other regions, e.g., higher than a dopant concentration in a region of the channel material 102 between the first S/D region 104-1 and the second S/D region 104-2, and, therefore, may be referred to as "highly doped" (HD) regions. In some embodiments, the S/D regions 104 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the channel material 102 to form the S/D regions 104. An annealing process that activates the dopants and causes them to diffuse further into the channel material 102 may follow the ion implantation process. In the latter process, the one or more semiconductor materials of the channel material 102 may first be etched to form recesses at the locations for the future S/D regions. An epitaxial deposition process may then be carried out to fill the recesses with material (which may include a combination of different materials) that is used to fabricate the S/D regions 104. In some implementations, the S/D regions 104 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 104 may be formed using one or more alternate semiconductor materials such as germanium or a group III-V material or alloy. Although FIG. 1 illustrates the first and second S/D regions 104 with a single pattern, suggesting that the material composition of the first and second S/D regions 104 is the same, this may not be the case in some other embodiments of the transistor 100. Thus, in some embodiments, the material composition of the first S/D region 104-1 may be different from the material composition of the second S/D region 104-2.

As further shown in FIG. 1, S/D contacts 106-1 and 106-2 (together referred to as "S/D contacts 106"), formed of one or more electrically conductive materials, may be used for providing electrical connectivity to the S/D regions 104-1 and 104-2, respectively. In various embodiments, one or more layers of metal and/or metal alloys may be used to form the S/D contacts 106. For example, the electrically conductive materials of the S/D contacts 106 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 106 may include one or more electrically conductive alloys, oxides, or carbides of one or more metals. In some embodiments, the S/D contacts 106 may include a doped semiconductor, such as silicon or another semiconductor doped with an N-type dopant or a P-type dopant. Metals may provide higher conductivity, while doped semiconductors may be easier to pattern during fabrication. Although FIG. 1 illustrates the first and second S/D contacts 106 with a single pattern, suggesting that the material composition of the first and second S/D contacts 106 is the same, this may not be the case in some other embodiments of the transistor 100. Thus, in some embodiments, the material composition of the first S/D contact 106-1 may be different from the material composition of the second S/D contact 106-2.

Turning to the gate stack 108, the gate electrode 110 may include at least one P-type WF metal or N-type WF metal, depending on whether the transistor 100 is a PMOS transistor or an NMOS transistor. For a PMOS transistor, metals that may be used for the gate electrode 110 may include, but are not limited to, ruthenium, palladium, platinum, cobalt, nickel, and conductive metal oxides (e.g., ruthenium oxide). For an NMOS transistor, metals that may be used for the gate electrode 110 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 110 may include a stack of two or more metal layers, where one or more metal layers are WF metal layers and at least one metal layer is a fill metal layer. Further metal layers may be included for other purposes, such as to act as a diffusion barrier layer, described below.

If used, the gate dielectric 112 may at least laterally surround the channel portion 114, and the gate electrode 110 may laterally surround the gate dielectric 112 such that the gate dielectric 112 is disposed between the gate electrode 110 and the channel material 104. In various embodiments, the gate dielectric 112 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 112 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 112 during manufacture of the transistor 100 to improve the quality of the gate dielectric 112. In some embodiments, the gate dielectric 112 may have a thickness between about 0.5 nanometers and 3 nanometers, including all values and ranges therein, e.g., between about 1 and 3 nanometers, or between about 1 and 2 nanometers.

In some embodiments, the gate dielectric 112 may be a multilayer gate dielectric, e.g., it may include any of the high-k dielectric materials in one layer and a layer of IGZO. In some embodiments, the gate stack 108 may be arranged so that the IGZO is disposed between the high-k dielectric and the channel material 104. In such embodiments, the IGZO may be in contact with the channel material 104 and may provide the interface between the channel material 104 and the remainder of the multilayer gate dielectric 112. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

In some embodiments, the gate stack 108 may be surrounded by a dielectric spacer, not specifically shown in FIG. 1. The dielectric spacer may be configured to provide separation between the gate stacks 108 of different transistors 100 which may be provided adjacent to one another (e.g., different transistors 100 provided along a single fin if the transistors 100 are FinFETs), as well as between the gate stack 108 and one of the S/D contacts 106 that is disposed on the same side as the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In stark contrast to conventional implementations where both S/D contacts are typically provided on a single side of a transistor, typically on the front side, e.g., where the gate stack 108 is provided, the two S/D contacts 106 are provided on different sides. Namely, as shown in FIG. 1, the second S/D contact 106-2 is provided on the same side as the gate stack 108, which may be considered to be the front side of the transistor 100, while the first S/D contact 106-1 is provided on the opposite side, which may be considered to be the back side of the transistor 100. Thus, the first S/D contact 106-1 is the back-side contact and the second S/D contact 106-2 is the front-side contact of the transistor 100. If considering the layers above a support structure (not shown in FIG. 1) over which the entire transistor 100 is built, then the first S/D contact 106-1 may be considered to be in a first layer 120-1 above the support structure, the second S/D contact 106-2 may be considered to be in a second layer 120-2 above the support structure, and a portion of the channel material 102 between the first S/D region 104-1 and the second S/D region 104-2 (e.g., the channel portion 114) is in a third layer 120-3 over the support structure. As can be seen from FIG. 1, the third layer 120-3 is between the first layer 120-1 and the second layer 120-2. At least a portion of the gate stack 108, or a contact to the gate stack 108 (such a gate contact not specifically shown in FIG. 1), may be provided in the same layer as one of the S/D contacts 106, e.g., in the second layer 120-2, as shown in FIG. 1. In further embodiments of the transistor 100, the first S/D contact 106-1 may also be implemented in the second layer 120-2.

Transistors with back-side S/D contacts as described herein, such as the transistor 100, may be implemented using any suitable transistor architecture, e.g., planar or non-planar architectures. One example structure is shown in FIGS. 2A-2B, illustrating perspective and cross-sectional views, respectively, of an example IC device 200 having a transistor with at least one back-side contact implemented as a FinFET, according to some embodiments of the present disclosure. Thus, the IC device 200 illustrates one example implementation of the transistor 100. Therefore, some of the reference numerals shown in FIGS. 2A-2B are the same as those used in FIG. 1, indicating the same or similar elements as those described with reference to FIG. 1, so that their descriptions are not repeated for FIGS. 2A-2B.

FinFETs refer to transistors having a non-planar architecture where a fin, formed of one or more semiconductor materials, extends away from a base (where the term "base" refers to any suitable support structure on which a transistor may be built, e.g., a substrate). A portion of the fin that is closest to the base may be enclosed by an insulator material. Such an insulator material, typically an oxide, is commonly referred to as a "shallow trench isolation" (STI), and the portion of the fin enclosed by the STI is typically referred to as a "subfin portion" or simply a "subfin." A gate stack that includes at least a layer of a gate electrode material and, optionally, a layer of a gate dielectric may be provided over the top and sides of the remaining upper portion of the fin (i.e., the portion above and not enclosed by the STI), thus wrapping around the upper-most portion of the fin. The portion of the fin over which the gate stack wraps around is typically referred to as a "channel portion" of the fin because this is where, during operation of the transistor, a conductive channel forms, and is a part of an active region of the fin. A source region and a drain region are provided on the opposite sides of the gate stack, forming, respectively, a source and a drain terminal of a transistor. FinFETs may be implemented as "tri-gate transistors," where the name "tri-gate" originates from the fact that, in use, such transistors may form conducting channels on three "sides" of the fin. FinFETs potentially improve performance relative to single-gate transistors and double-gate transistors.

FIG. 2A is a perspective view, while FIG. 2B is a cross-sectional side view of an IC device/Fin FET 200 with one front-side and one back-side S/D contact, according to some embodiments of the disclosure. FIGS. 2A-2B illustrate the channel material 102, the S/D regions 104, and the gate stack 108 showing the gate electrode 110 and the gate dielectric 112 as described above. As shown in FIGS. 2A-2B, when the transistor 100 is implemented as a FinFET, the FinFET 200 may further include a base 202, a fin 204, and an STI material 206 enclosing the subfin portion of the fin 204. The S/D contacts 106 are not specifically shown in FIGS. 2A-2B in order to not clutter the drawings. The cross-sectional side view of FIG. 2B is the view in the y-z plane of the example coordinate system x-y-z shown in FIG. 2A, with the cross-section of FIG. 2B taken across the fin 204 (e.g., along the plane shown in FIG. 2A as a plane AA). On the other hand, the cross-sectional side view of FIG. 1 is the view in the x-z plane of the example coordinate system as shown in FIG. 2A with the cross-section taken along the fin 204 for one example portion of the gate stack 108 (e.g., along the plane shown in FIG. 2A and in FIG. 2B as a plane BB).

As shown in FIGS. 2A-2B, the fin 204 may extend away from the base 202 and may be substantially perpendicular to the base 202. The fin 204 may include one or more semiconductor materials, e.g., a stack of semiconductor materials, so that the upper-most portion of the fin (namely, the portion of the fin 204 enclosed by the gate stack 108) may serve as the channel region of the FinFET 200. Therefore, the upper-most portion of the fin 204 may be formed of the channel material 102 as described above and may include the channel portion 114.

The subfin of the fin 204 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For some example N-type transistor embodiments, the subfin portion of the fin 204 may be a III-V material having a band offset (e.g., conduction band offset for N-type devices) from the channel portion. Example materials, include, but are not limited to, GaAs, GaSb, GaAsSb, GaP, InAlAs, GaAsSb, AlAs, AlP, AlSb, and AlGaAs. In some N-type transistor embodiments of the FinFET 200 where the channel portion of the fin 204 (e.g., the channel portion 114) is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 204 are each, or include, group IV semiconductors (e.g., Si, Ge, SiGe). The subfin of the fin 204 may be a first elemental semiconductor (e.g., Si or Ge) or a first SiGe alloy (e.g., having a wide bandgap). For some example P-type transistor embodiments, the subfin of the fin 204 may be a group IV material having a band offset (e.g., valance band offset for P-type devices) from the channel portion. Example materials, include, but are not limited to, Si or Si-rich SiGe. In some P-type transistor embodiments, the subfin of the fin 204 is Si and at least a portion of the subfin may also be doped with impurities (e.g., N-type) to a higher impurity level than the channel portion.

As further shown in FIGS. 2A-2B, the STI material 206 may enclose portions of the sides of the fin 204. A portion of the fin 204 enclosed by the STI 106 forms a subfin. In various embodiments, the STI material 206 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 206 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

The gate stack 108 may wrap around the upper portion of the fin 204 (the portion above the STI 206), as shown in FIGS. 2A-2B, with a channel portion of the fin 204 (e.g., the channel portion 114, described above) corresponding to the portion of the fin 204 wrapped by the gate stack 108 as shown in FIGS. 2A-2B. In particular, the gate dielectric 112 (if used) may wrap around the upper-most portion of the fin 204, and the gate electrode 110 may wrap around the gate dielectric 112. The interface between the channel portion and the subfin portion of the fin 204 is located proximate to where the gate electrode 110 ends.

In some embodiments, the FinFET 200 may have a gate length, GL, (i.e., a distance between the first S/D region 104-1 and the second S/D region 104-2), a dimension measured along the fin 204 in the direction of the x-axis of the example reference coordinate system x-y-z shown in FIG. 1 and FIGS. 2A-2B, which may, in some embodiments, be between about 5 and 40 nanometers, including all values and ranges therein (e.g., between about 22 and 35 nanometers, or between about 20 and 30 nanometers). The fin 204 may have a thickness, a dimension measured in the direction of the y-axis of the reference coordinate system x-y-z shown in FIGS. 2A-2B, that may, in some embodiments, be between about 5 and 30 nanometers, including all values and ranges therein (e.g., between about 7 and 20 nanometers, or between about 10 and 15 nanometers). The fin 204 may have a height, a dimension measured in the direction of the z-axis of the reference coordinate system x-y-z shown in FIG. 1, which may, in some embodiments, be between about 30 and 350 nanometers, including all values and ranges therein (e.g., between about 30 and 200 nanometers, between about 75 and 250 nanometers, or between about 150 and 300 nanometers).

Although the fin 204 illustrated in FIGS. 2A-2B is shown as having a rectangular cross-section in a y-z plane of the reference coordinate system shown, the fin 204 may instead have a cross-section that is rounded or sloped at the "top" of the fin 204, and the gate stack 108 may conform to this rounded or sloped fin 204. In use, the FinFET 200 may form conducting channels on three "sides" of the channel portion of the fin 204, potentially improving performance relative to single-gate transistors (which may form conducting channels on one "side" of a channel material or substrate) and double-gate transistors (which may form conducting channels on two "sides" of a channel material or substrate).

While not specifically shown in FIG. 2A, S/D contacts 106 may be electrically connected to the S/D regions 104, but extending in different vertical directions with respect to the fin 204. For example, the first S/D contact 106-1 may be electrically connected to the first S/D region 104-1 and extend from the first S/D region 104-1 towards the base 202, thus forming a back-side S/D contact for the FinFET 200, similar to the illustration of FIG. 1. In such implementation, the second S/D contact 106-2 may be electrically connected to the second S/D region 104-2 and extend from the second S/D region 104-2 away from the base 202, thus forming a front-side S/D contact for the FinFET 200, also similar to the illustration of FIG. 1.

While FIGS. 2A-2B illustrate a single FinFET 200, in some embodiments, a plurality of FinFETs may be arranged next to one another (with some spacing in between) along the fin 204. Furthermore, in various further embodiments, the transistor 100 with one front-side and one back-side S/D contacts may be implemented in many other transistor architectures besides the FinFET 200, such as planar FETs, nanowire FETs, or nanoribbon FETs.

Example Memory Implementations

Embedded memory is important to the performance of modern system-on-a-chip (SoC) technology, especially to enable 3D monolithic integration. IC assemblies with back-side power delivery and glass support at the front may include embedded memory. Therefore, some considerations related to memory will now be described.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to dynamic random-access memory (DRAM) and in particular, embedded DRAM (eDRAM), because this type of memory has been introduced in the past to address the limitation in density and standby power of large static random-access memory (SRAM)-based caches. However, embodiments of the present disclosure are equally applicable to memory cells implemented other technologies. Thus, in general, memory cells described herein may be implemented as eDRAM cells, spin-transfer torque random-access memory (STTRAM) cells, resistive random-access memory (RRAM) cells, or any other nonvolatile memory cells.

A memory cell, e.g., an eDRAM cell, may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source/drain (S/D) terminal of the access transistor (e.g., to the source terminal of the access transistor), while the other S/D terminal of the access transistor may be coupled to a bitline (BL), and a gate terminal of the transistor may be coupled to a wordline (WL). Since such a memory cell can be fabricated with as little as a single access transistor, it can provide higher density and lower standby power versus SRAM in the same process technology.

Various 1T-1C memory cells have, conventionally, been implemented with access transistors being FEOL, logic-process based, transistors implemented in an upper-most layer of a semiconductor substrate. Inventors of the present disclosure realized that using conventional logic transistors creates several challenges if such transistors are to be used to create three-dimensional memory and logic devices.

One challenge relates to the location of the capacitors such memory cells. Namely, it may be desirable to provide capacitors in metal layers close to their corresponding access transistors. Since logic transistors are implemented as FEOL transistors provided directly on the semiconductor substrate, the corresponding capacitors of 1T-1C memory cells then have to be embedded in lower metal layers in order to be close enough to the logic access transistors. As the pitches of lower metal layers aggressively scale in advanced technology nodes, embedding the capacitors in the lower metal layers poses significant challenges to the scaling of 1T-1C based memory and to creation of three-dimensional memory devices.

Another challenge resides in that, given a usable surface area of a substrate, there are only so many FEOL transistors that can be formed in that area, placing a significant limitation on the density of memory cells or logic devices incorporating such transistors.

Implementing transistors of memory cells (e.g., access transistors of memory cells) as transistors with back-side contacts may improve on at least some of the challenges and issues described above. For example, moving access transistors of memory cells to the BEOL layers (enabled by the back-side contact architecture) means that their corresponding capacitors can be implemented in the upper metal layers with correspondingly thicker interlayer dielectric (ILD) and larger metal pitch to achieve higher capacitance, which may ease the integration challenge introduced by embedding the capacitors.

FIG. 3 provides a schematic illustration of a cross-sectional view of an example memory cell 300 that includes a transistor with a back-side contact, according to some embodiments of the present disclosure. FIG. 3 illustrates how the transistor 100 may be used to form a 1T-1C memory cell. In particular, the memory cell 300 illustrates all of the components of the transistor 100 of FIG. 1 (the descriptions of which, therefore, not repeated here), and further schematically illustrates that, in some embodiments, a capacitor 302 may be coupled to the back-side S/D contact 106-1 of the transistor 100. The capacitor 302 may be any suitable capacitor, e.g., a metal-insulator-metal (MIM) capacitor for storing a bit value, or a memory state (e.g., logical "1" or "0") of the memory cell 300, and the transistor 100 may then function as an access transistor controlling access to the memory cell 300 (e.g., access to write information to the cell or access to read information from the cell. By coupling the capacitor 302 to the S/D region 104-1, the capacitor 302 is configured to store the memory state of the memory cell 300. In some embodiments, the capacitor 302 may be coupled to the S/D region 104-1 via a storage node (not specifically shown in FIG. 3) coupled to the S/D region 104-1. In some embodiments, the S/D contact 106-1 may be considered to be the storage node.

Although not specifically shown in FIG. 3, the memory cell 300 may further include a bitline to transfer the memory state and coupled to the one of the S/D regions 104 to which the capacitor 302 is not coupled (e.g., to the S/D region 104-2, for the illustration of FIG. 3). Such a bitline can be connected to a sense amplifier and a bitline driver which may, e.g., be provided in a memory peripheral circuit associated with a memory array in which the memory cell 300 may be included. Furthermore, although also not specifically shown in FIG. 3, the memory cell 300 may further include a wordline, coupled to the gate terminal of the transistor 100, e.g., coupled to the gate stack 108, to supply a gate signal. The transistor 100 may be configured to control transfer of a memory state of the memory cell 300 between the bitline and the storage node or the capacitor 302 in response to the gate signal.

Example IC Assemblies with Glass Support at the Front

Transistors with back-side contacts may enable 3D integration of IC assemblies with back-side power delivery and glass support at the front. An example IC assembly is shown in FIG. 4, providing a block diagram of an IC assembly 400 with back-side power delivery and glass support at the front, according to some embodiments of the present disclosure.

Figure 4:
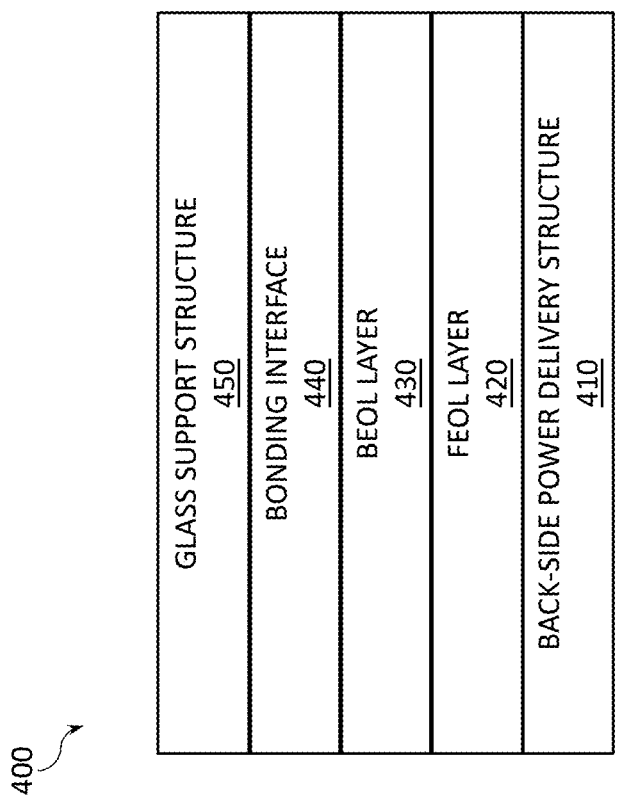
FIG. 4 provides a block diagram of an integrated circuit (IC) assembly with back-side power delivery and glass support at the front, according to some embodiments of the present disclosure.

As shown in FIG. 4, the IC assembly 400 may include an FEOL layer 420 and a BEOL layer 430 above FEOL layer 420. The FEOL layer 420 may include a plurality of FEOL devices, e.g., FEOL transistors implemented as transistors with back-side contacts. The BEOL layer 430 may include at least a plurality of interconnects electrically coupled to (e.g., in electrically conductive contact with at least portions of) one or more of the plurality of FEOL devices of the FEOL layer 420. In some embodiments, the BEOL layer 430 may further include BEOL devices, e.g., backend transistors, at least some of which may be implemented as transistors with back-side contacts.

In various embodiments, the FEOL transistors with back-side contacts, implemented in the FEOL layer 420, may be a part of compute logic and/or a part of a memory array.

For example, in some embodiments, some of the FEOL transistors of the FEOL layer 420 may be access transistors of memory cells of a memory array, e.g., of the 1T-1C memory cells as described above. In such embodiments, the capacitors of such memory cells may then be implemented in the BEOL layer 430. In other embodiments, some of the FEOL transistors of the FEOL layer 420 may be access transistors of memory cells of a type other than 1T-1C. In such embodiments, other portions of the memory cells (e.g., storage transistors) may be implemented in the BEOL layer 430.

In another example, some of the FEOL transistors of the FEOL layer 420 may be a part of compute logic of the IC assembly 400. For example, such transistors may be responsible for compute logic functionality related to read/write operations with respect to the data stored in the memory cells that may be implemented in the BEOL layer 430. To that end, some of the FEOL transistors of the FEOL layer 420 may be part of one or more input/output (I/O) ICs (e.g., a memory peripheral circuit) configured to control (e.g., control access (read/write), store, refresh) the memory cells implemented in the IC assembly 400 (e.g., memory cells implemented in the BEOL layer 430). In some embodiments, some of the FEOL transistors of the FEOL layer 420 may be part of high-performance compute logic, configured to perform various operations with respect to data stored in the memory cells implemented in the IC assembly 400 (e.g., arithmetic and logic operations, pipelining of data from one or more of the memory arrays implemented in the IC assembly 400, and possibly also data from external devices/chips).

Transistors with back-side contacts as described herein, either as a standalone transistors (e.g., the transistor 100) or included as a part of a memory cell (e.g., the memory cell 300), may be included in various regions/locations in the IC assembly 400. For example, the transistor 100 may be used as, e.g., a logic transistor in the compute logic (e.g., included in the FEOL layer 420). In another example, the transistor 100 may be used as, e.g., access transistors in the one or more memory layers of the BEOL 430. Providing transistors with back-side contacts may ease the integration challenge introduced by embedding the storage nodes (e.g., storage capacitors) of memory cells, and make building of three-dimensional memory and logic devices with a stacked architecture with many layers of memory and/or compute logic feasible.

The illustration of FIG. 4 is intended to provide a general orientation and arrangement of various layers with respect to one another, and, unless specified otherwise in the present disclosure, includes embodiments of the IC device 400 where portions of elements described with respect to one of the layers shown in FIG. 4 may extend into one or more, or be present in, other layers. For example, power and signal interconnects for the various IC components of the IC assembly 400 may be present in any of the layers shown in FIG. 4, although not specifically illustrated in IG. 4. Furthermore, although a single BEOL layer 430 is shown in FIG. 4, in various embodiments, the BEOL layer 430 of the IC assembly 400 may include a plurality of BEOL layers.

In some embodiments, the BEOL layer 430 may include one or more memory layers which may form one or more memory arrays. Such a memory array may include access transistors (e.g., the transistor 100), storage nodes (e.g., storage capacitors or storage transistors), as well as word-lines (e.g., row selectors) and bitlines (e.g., column selectors), making up memory cells. In some embodiments, the memory layers of the BEOL layer 430 may include TFT-based memory cells. On the other hand, the FEOL layer 420 may include various logic layers, circuits, and devices (e.g., logic transistors) to drive and control a logic IC. For example, the logic devices of the FEOL layer 420 may form a memory peripheral circuit to control (e.g., access (read/write), store, refresh) the memory cells of the BEOL layer 430. In some embodiments of the IC assembly 400, the compute logic may be provided in the FEOL 420 and in one or more lowest metal layer of the BEOL layer 430, while the one or more memory arrays may be provided in higher layers of the BEOL layer 430. In other embodiments of the IC assembly 400, the compute logic described with reference to the FEOL layer 420 may be provided above the FEOL layer 420 (e.g., in the BEOL layer 430), in between memory layers of the BEOL layer 430, or combined with the memory layers of the BEOL layer 430.

Various BEOL layers of the BEOL layer 430 may be/include metal layers of a metallization stack of the IC assembly 400. Various metal layers of the BEOL may be used to interconnect the various inputs and outputs of the logic devices in the compute logic of the FEOL layer 420 and/or of the memory cells in the memory layers of the BEOL layer 430. Generally speaking, each of the metal layers of the BEOL layer 430 may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL layer 430 may include only certain patterns of conductive metals, e.g., copper (Cu), aluminum (Al), tungsten (W), or cobalt (Co), or metal alloys, or more generally, patterns of an electrically conductive material, formed in an insulating medium such as an ILD. The insulating medium may include any suitable ILD materials such as silicon oxide, carbon-doped silicon oxide, silicon carbide, silicon nitride, aluminum oxide, and/or silicon oxynitride.

The FEOL layer 420 may originally be provided over a semiconductor support structure such as a substrate, a die, a wafer or a chip, and may include any of the materials, or combinations of materials, described with reference to the support structure for the embodiments of FIGS. 1-3. However, such a semiconductor support structure may subsequently be removed to expose the back-side portions of the FEOL devices of the FEOL layer 420 so that a back-side power delivery structure 410 may be provided at the back side of the FEOL layer 420 (thus, the BEOL layer 430 is provided at the front side of the FEOL layer 420 and the back-side power delivery structure 410 is provided at the back side of the FEOL layer 420).

As also shown in FIG. 4, the IC assembly 400 may further include a bonding interface 440 and a glass support structure 450, where the bonding interface 440 may be an interface where a top face of the BEOL layer 430 is bonded to a face of the glass support structure 450. Thus, in the IC assembly 400, the FEOL layer 420 is between the back-side power delivery structure 410 and the BEOL layer 430, and the BEOL layer 430 is between the FEOL layer 420 and the glass support structure 450.

FIGS. 5-8 provide schematic illustrations of example implementations of the IC assembly 400, according to various embodiments of the present disclosure.

Figures 5, 6:
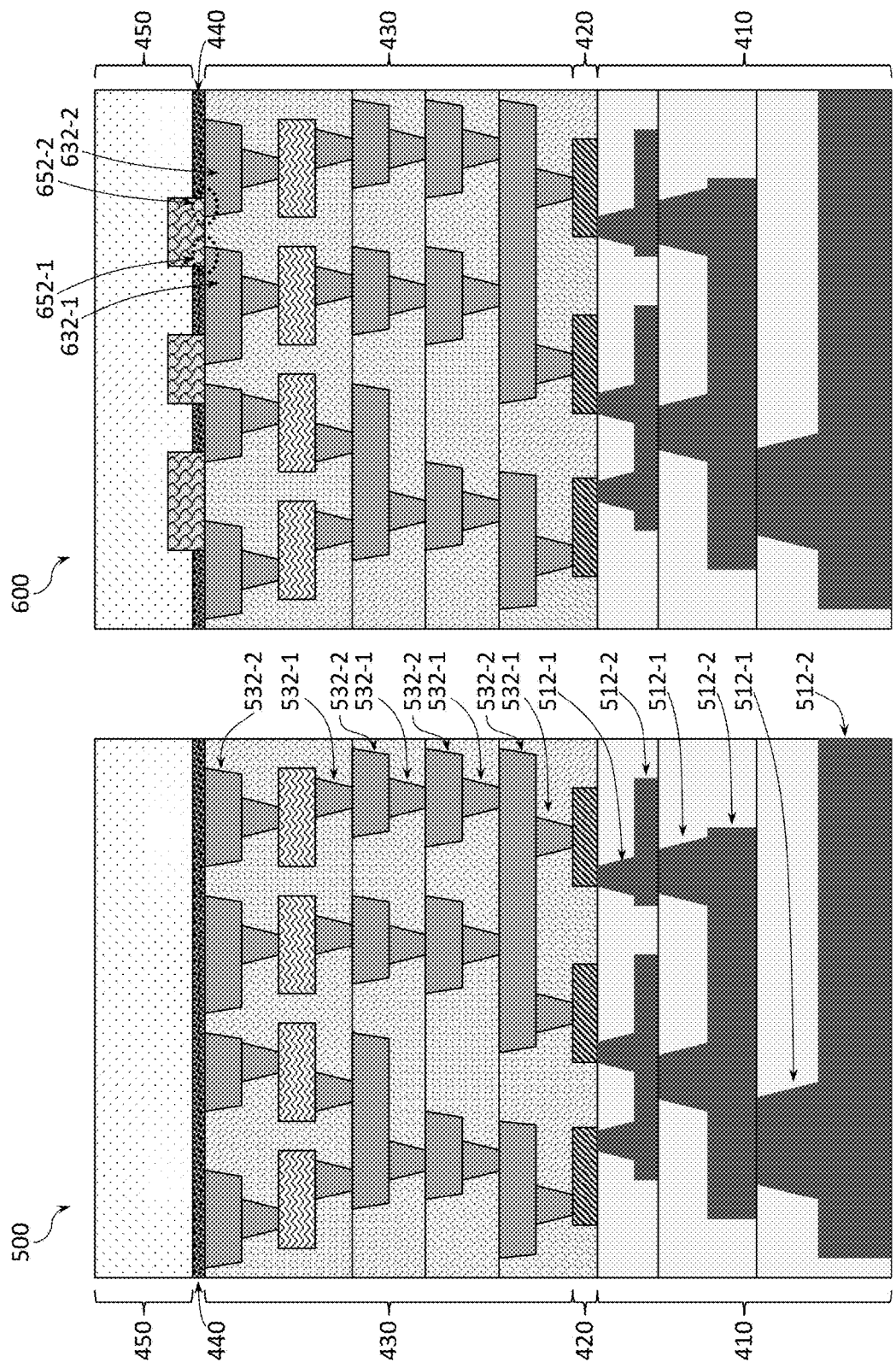

FIG. 5 provides a schematic illustration of an IC assembly 500 with back-side power delivery and glass support at the front, according to some embodiments of the present disclosure. Portions of the IC assembly 400 that were shown in FIG. 4, such as the back-side power delivery structure 410, the FEOL 420, etc., are labeled in the IC assembly 500 of FIG. 5. The IC assembly 500 further illustrates example implementations of each of these portions.

As shown in FIG. 5, the back-side power delivery structure 410 may include a plurality of power interconnects 512, arranged in one or more layers (three such layers are shown in FIG. 5, separated by horizontal lines, but such separation may be absent in other embodiments, or other embodiments may include different number of layers and/or different arrangements of the power interconnects 512 than what is shown in FIG. 5). The power interconnects 512 may include any suitable combination of vias 512-1 and lines 512-2, some of which are labeled in FIG. 5 and some of which are not labeled in order to not clutter the drawing. The power interconnects 512 may include any suitable conductive materials, such as any of the conductive metals or metal alloys as described above. Portions of various ones of the power interconnects 512 may be enclosed by an insulator material 514, which may include any of the ILD materials described above.

As further shown in FIG. 5, the FEOL layer 420 may include a plurality of FEOL devices 526. One or more of the FEOL devices 526 may be transistors with back-side contacts as described above, e.g., the transistors 100. In various embodiments, the FEOL devices 526 may include one or more of fin-based transistors, nanoribbon transistors, and nanowire transistors as known in the art, but with one or more back-side contacts as described herein. One or more of the power interconnects 512 may then be coupled to one or more S/D regions of such transistors with back-side contacts (i.e., one or more power interconnects 512 may form back-side contacts to one or more S/D regions of the transistors of the FEOL devices 526).

As also shown in FIG. 5, the BEOL layer 430 may include a plurality of BEOL interconnects 532, which may include any suitable conductive materials, such as any of the conductive metals or metal alloys as described above. The BEOL interconnects 532 may include any suitable combination of vias 532-1 and lines 532-2, some of which are labeled in FIG. 5 and some of which are not labeled in order to not clutter the drawing. One or more of the BEOL interconnects 532 may be electrically coupled to (e.g., in electrically conductive contact with at least portions of) one or more of the plurality of FEOL devices 526. At least portions of the BEOL interconnects 532 may be enclosed by an insulator material 534, which may include any of the ILD materials described above. In some embodiments, an insulator material such as the insulator material 534 may also at least partially enclose portions of the FEOL devices 526. FIG. 5 also schematically illustrates that the BEOL layer 430 may include a layer of memory cells 536. The memory cells 536 may be any of the memory cells described above, e.g., TFT-based memory cells, e.g., the memory cells 300. In further embodiments, the IC assembly 500 may include multiple layers of the memory cells 536.

In some embodiments, the cross-sectional side views of the BEOL interconnects 532 and the power interconnects 512 may have characteristic differences due to the fact that the BEOL interconnects 532 and the power interconnects 512 are formed on different sides of the FEOL layer 420. In particular, in such embodiments, cross-sections, in a plane perpendicular to the FEOL layer 420, of at least some of the BEOL interconnects 532 and at least some of the power interconnects 512 may be trapezoids. Such trapezoids may include two parallel sides, one of which is a short side and one of which is a long side (i.e., the length of the long side is greater than the length of the short side). Characteristic to the fact that the BEOL interconnects 532 and the power interconnects 512 are formed on different sides of the FEOL layer 420, for the trapezoids of the BEOL interconnects 532, the long side would be closer to the glass support structure 450 than the short side and the short side would be closer to the FEOL layer 420 than the long side, whereas, for the trapezoids of the power interconnects 512, the short side would be closer to both the glass support structure 450 and the FEOL layer 420 than the long side.

FIG. 5 further illustrates a bonding interface material 540, which may be used to implement the bonding interface 440, bonding the upper face of the BEOL layer 430 to a non-semiconductor support structure 550 that may be used to implement the glass support structure 450 as described above. In some embodiments, the bonding interface material 540 may include an oxide, e.g., silicon oxide. As shown in FIG. 5, in some embodiments, portions (e.g., one face) of the bonding interface material 540 may be in contact with one or more portions of the glass support structure 450, while other portions (e.g., the opposing face) of the bonding interface material 540 may be in contact with one or more portions of the BEOL layer 430. In some embodiments, the bonding interface material 540 may have a thickness between about 1 nanometer and 100 nanometers, e.g., between about 1 and 50 nanometers, or between about 1 and 20 nanometers.

In some embodiments, the non-semiconductor support structure 550 may include a glass material. Examples of glass materials include silicon oxide materials, possibly doped with elements and compounds such as boron, carbon, aluminum, hafnium oxide, e.g., in doping concentrations of between about 0.01% and 10%. In other embodiments, the non-semiconductor support structure 550 may include other solid materials having a dielectric constant lower than that of Si, e.g., lower than about 10.5. In some embodiments, the non-semiconductor support structure 550 may include mica. A thickness of the glass support structure 450 may be of any value for the glass support structure 450 to provide mechanical stability for the IC assembly 400 and, possibly, to support inclusion of various devices for further reducing the parasitic effects in the IC assembly (some such devices being shown in FIG. 6 and described above). In some embodiments, the glass support structure 450 may have a thickness between about 0.2 micrometer (micron) and 100 micron, e.g., between about 0.5 and 5 micron, or between about 1 and 3 micron.

FIG. 6 provides a schematic illustration of an IC assembly 600 with back-side power delivery and glass support with thin-film devices at the front, according to some embodiments of the present disclosure. Portions of the IC assembly 400 that were shown in FIG. 4, such as the back-side power delivery structure 410, the FEOL 420, etc., are labeled in the IC assembly 600 of FIG. 6. The IC assembly 600 further illustrates example implementations of each of these portions. In particular, the IC assembly 600 may be implemented as the IC assembly 500 as described above (which is shown in FIG. 6 with the IC assembly 600 including some of the same elements, showing using the same patterns, as those included in the IC assembly 500 illustrated in FIG. 5), except that the IC assembly 600 further includes one or more thin-film devices 556 disposed in the glass support structure 450. In the interests of brevity, detailed descriptions of the IC assembly 500 are not repeated with respect to the IC assembly 600, and only the differences are described. Furthermore, in order to not clutter the drawing of FIG. 6, the power interconnects 512-1 and 512-2 and the BEOL interconnects 532-1 and 532-2 are not specifically labeled in FIG. 6 as they were labeled in FIG. 5.

In various embodiments, the thin-film devices 556 may be two-terminal devices such as thin-film resistors, thin-film capacitors, and thin-film inductors, configured to reduce the parasitic effects within the IC assembly 600. The first terminal of such a two-terminal thin-film device 556 may be electrically coupled (e.g., in electrically conductive contact with) to a first BEOL interconnect of the plurality of BEOL interconnects 532, while the second terminal may be electrically coupled (e.g., in electrically conductive contact with) to a second BEOL interconnect of the plurality of BEOL interconnects 532. One example of such two-terminal coupling is labeled in FIG. 6 for one of the thin-film devices 556 (although three different thin-film devices 556 are shown in the example of FIG. 6) with the first terminal of the thin-film device 556 shown on the right side of the IC assembly 600 being coupled to a first BEOL interconnect 612-1 of the plurality of BEOL interconnects 532 (said coupling shown in FIG. 6 within a dotted contour 652-1), and with the second terminal of the thin-film device 556 shown on the right side of the IC assembly 600 being coupled to a second BEOL interconnect 612-2 of the plurality of BEOL interconnects 532 (said coupling shown in FIG. 6 within a dotted contour 652-2). As shown in FIG. 6, in some embodiments, portions of the thin-film devices 556 may extend through the bonding interface 450 to make electrical contact to respective portions of the BEOL interconnects 532.

FIG. 7 provides a schematic illustration of an IC assembly 700 with back-side power delivery and glass support with an active layer at the front, according to some embodiments of the present disclosure. Portions of the IC assembly 400 that were shown in FIG. 4, such as the back-side power delivery structure 410, the FEOL 420, etc., are labeled in the IC assembly 700 of FIG. 7. The IC assembly 700 further illustrates example implementations of each of these portions. In particular, the IC assembly 700 may be implemented as the IC assembly 500 as described above (which is shown in FIG. 7 with the IC assembly 700 including some of the same elements, showing using the same patterns, as those included in the IC assembly 500 illustrated in FIG. 5), except that the IC assembly 700 further includes an active layer 650 between the glass support structure 450 and the BEOL layer 430. In the interests of brevity, detailed descriptions of the IC assembly 500 are not repeated with respect to the IC assembly 700, and only the differences are described. Furthermore, in order to not clutter the drawing of FIG. 7, the power interconnects 512-1 and 512-2 and the BEOL interconnects 532-1 and 532-2 are not specifically labeled in FIG. 7 as they were labeled in FIG. 5.

As shown in FIG. 7, the active layer 750 may be provided between the glass support structure 450 and the bonding interface 440, and the bonding interface 440 may then be between the active layer 750 and the BEOL layer 430. In some embodiments, some portions of the bonding interface 440 may be in contact with one or more portions of the active layer 750, and other portions of the bonding interface 440 may be in contact with one or more portions of the BEOL layer 430. The bonding interface 440 may be a hybrid bonding interface in such embodiments, e.g., as described below with reference to FIG. 10.

As shown in FIG. 7, the active layer 750 may include a plurality of interconnects 752, arranged in one or more layers (two such layers are shown in FIG. 7, separated by horizontal lines, but such separation may be absent in other embodiments, or other embodiments may include different number of layers and/or different arrangements of the interconnects 752 than what is shown in FIG. 7). The interconnects 752 may include any suitable combination of vias 752-1 and lines 752-2, some of which are labeled in FIG. 7 and some of which are not labeled in order to not clutter the drawing. The interconnects 752 may include any suitable conductive materials, such as any of the conductive metals or metal alloys as described above. Portions of various ones of the interconnects 752 may be enclosed by an insulator material 754, which may include any of the ILD materials described above. One or more of the interconnects 752 of the active layer 750 may be electrically coupled to (e.g., in electrically conductive contact with at least portions of) one or more of the plurality of BEOL interconnects 532.

As further shown in FIG. 7, the IC assembly 700 may further include a plurality of devices 756, such as transistors or memory cells. FIG. 7 illustrates the devices 756 as part of the glass support structure 450, although, in other embodiments of the IC assembly 700, the devices 756 may be a part of the active layer 750. In some embodiments, one or more of the devices 756 may be transistors as described above, e.g., the transistors 100. In some embodiments, one or more of the devices 756 may be memory cells as described above, e.g., the memory cells 300 or any other embedded memory cells. One or more of the interconnects 752 may then be coupled to one or more portions of the devices 756 and to one or more of the plurality of BEOL interconnects 532.

In some embodiments, the cross-sectional side views of the interconnects 752 may have characteristic differences due to the fact that the interconnects 752 and the BEOL interconnects 532 are formed on different sides of the bonding interface 440. In particular, in such embodiments, cross-sections, in a plane perpendicular to the FEOL layer 420, of at least some of the interconnects 752 may be trapezoids with one short side and one long side. Such trapezoids may include two parallel sides, one of which is a short side and one of which is a longer side (i.e., the length of the longer side is greater than the length of the short side). Characteristic to the fact that interconnects 732 and the BEOL interconnects 532 are formed on different sides of the bonding interface 440, for the trapezoids of the interconnects 732, the short side would be closer to the glass support structure 450 than the long side and the long side would be closer to the bonding interface 440 and the FEOL layer 420 than the short side, whereas, for the trapezoids of the BEOL interconnects 512, the long side would be closer to both the glass support structure 450 and the bonding interface 440 than the short side.

FIG. 8 provides a schematic illustration of an IC assembly 800 with back-side power delivery and glass support with thin-film devices and an active layer at the front, according to some embodiments of the present disclosure. Portions of the IC assembly 400 that were shown in FIG. 4, such as the back-side power delivery structure 410, the FEOL 420, etc., are labeled in the IC assembly 800 of FIG. 8. The IC assembly 800 further illustrates example implementations of each of these portions. In particular, the IC assembly 800 may be implemented as the IC assembly 600 with the one or more thin-film devices 556 disposed in the glass support structure 450 as described above, further including the active layer 750 of the IC assembly 700 as described above. This is shown in FIG. 8 with the IC assembly 800 including some of the same elements, showing using the same patterns, as those included in the IC assembly 600 illustrated in FIG. 6 and in the IC assembly 700 illustrated in FIG. 7. Descriptions of the IC assemblies with the one or more thin-film devices 556 disposed in the glass support structure 450 and with the active layer 750, provided with reference to FIGS. 6 and 7, are applicable to the IC assembly 800 of FIG. 8 and, therefore, in the interests of brevity, are not repeated.

Example Fabrication Methods

IC assemblies with back-side power delivery and glass support at the front, as described herein, may be fabricated using any suitable techniques, e.g., subtractive, additive, damascene, dual damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

FIGS. 9A-9D illustrate a first example method of forming an IC assembly with back-side power delivery and glass support at the front, according to some embodiments of the present disclosure. FIGS. 10A-10D illustrate a second example method of forming an IC assembly with back-side power delivery and glass support at the front, according to some embodiments of the present disclosure. The IC assemblies shown in FIGS. 9 and 10 include some of the same elements, showing using the same patterns, as those included in the IC assemblies shown in FIGS. 5-8. In the interests of brevity, detailed descriptions of those elements are applicable to the IC assembles shown in FIGS. 9 and 10, and are not repeated.

Figure 9D:
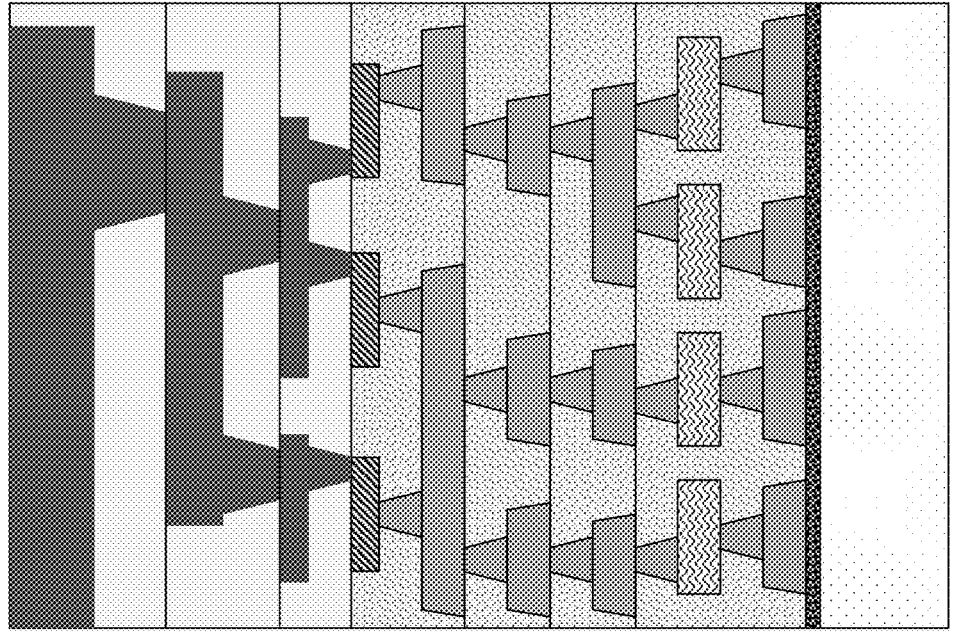
Figure 9C:
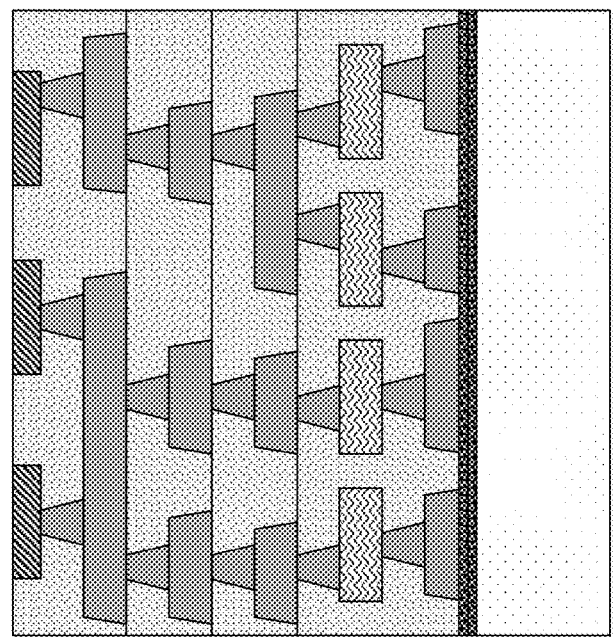

FIG. 9A illustrates an IC structure 900A, showing that the first fabrication method may begin with forming a plurality of FEOL devices 526 over a semiconductor support structure 902, which may include any of the support structures described with reference to FIGS. 1-3, then forming the BEOL 430 over the FEOL layer 420 with the FEOL devices 526, and then providing a layer of a bonding interface material 540 over the upper-most surface of the BEOL layer 430. FIG. 9B illustrates an IC structure 900B, showing that the first fabrication method may then proceed with flipping the IC structure 900A of FIG. 9A upside down and bringing the bonding interface material 540 of the IC structure 900A in contact with a bonding interface material provided at the upper surface of the glass support structure 450, thus performing bonding of the IC structure 900A and the glass support structure 450. In general, bonding as described herein may be an insulator-insulator bonding, e.g., as oxide-oxide bonding, where a bonding interface material may be applied to one or both faces of the structures to be bonded, and then the structures are put together, possibly while applying a suitable pressure and heating up the assembly to a suitable temperature (e.g., to moderately high temperatures, e.g., between about 50 and 200 degrees Celsius) for a duration of time. In some embodiments, the bonding interface material 540 may be an adhesive material that ensures attachment of the IC structure 900A and the glass support structure 450 to one another as shown in FIG. 9B and FIG. 9C. In some embodiments, the bonding interface material 540 may be an etch-stop material. In some embodiments, the bonding interface material 540 may be both an etch-stop material and have suitable adhesive properties to ensure attachment of the IC structures to one another as described herein. In some embodiments, no deliberately added adhesive bonding material may be used, in which case the layer labeled "540" or "440" in the present drawings represents a bonding interface resulting from the bonding of the respective IC structures to one another. Such a bonding interface may be recognizable as a seam or a thin layer in the IC assemblies described herein, using, e.g., selective area diffraction (SED), even when the specific materials of the insulators of the IC structures that are bonded together may be the same, in which case the bonding interface would still be noticeable as a seam or a thin layer in what otherwise appears as a bulk insulator (e.g., bulk oxide) layer. As used herein, unless specified otherwise, references to the "bonding interface material 540" or the "bonding interface 440" are applicable to a "bonding interface" for the embodiments where no deliberately added adhesive material is used to bond the IC structures as described herein. FIG. 9C illustrates an IC structure 900C, showing that, after bonding of the IC structure 900A and the glass support structure 450 has been performed, the first fabrication method may proceed with removing the semiconductor support structure 902 (e.g., using a suitable polishing or grinding process) to reveal back sides of the FEOL devices 526 of the FEOL 420. FIG. 9D illustrates an IC structure 900D, showing that, after the back sides of the FEOL devices 526 of the FEOL 420 have been revealed, the first fabrication method may proceed with providing the back-side power delivery structure 410 as described above.

FIG. 10A illustrates an IC structure 1000A, showing that the second fabrication method may begin with forming a plurality of FEOL devices 526 over a semiconductor support structure 902, which may include any of the support structures described with reference to FIGS. 1-3, and then forming the BEOL 430 over the FEOL layer 420 with the FEOL devices 526. FIG. 10B illustrates an IC structure 1000B, showing that the second fabrication method may then proceed with flipping the IC structure 1000A of FIG. 10A upside down and bringing the BEOL layer 430 of the IC structure 1000A in contact with the upper surface of the active layer 750 provided over the glass support structure 450, thus performing hybrid bonding of the IC structure 1000A and the glass support structure 450. Descriptions of bonding provided for FIGS. 9A-9D are applicable to the bonding of the IC structure 1000A and the glass support structure 450 and, therefore, in the interests of brevity, are not repeated. FIG. 10C illustrates an IC structure 1000C, showing that, after bonding of the BEOL layer 430 of the IC structure 900A and the active layer 750 has been performed, a bonding interface 440 may be formed between the active layer 750 and the BEOL layer 430. FIG. 10D illustrates that, subsequently, the second fabrication method may proceed with removing the semiconductor support structure 902 (e.g., using a suitable polishing or grinding process) to reveal back sides of the FEOL devices 526 of the FEOL 420 and, after that, providing the back-side power delivery structure 410 as described above.

Example Electronic Devices

Figure 11:
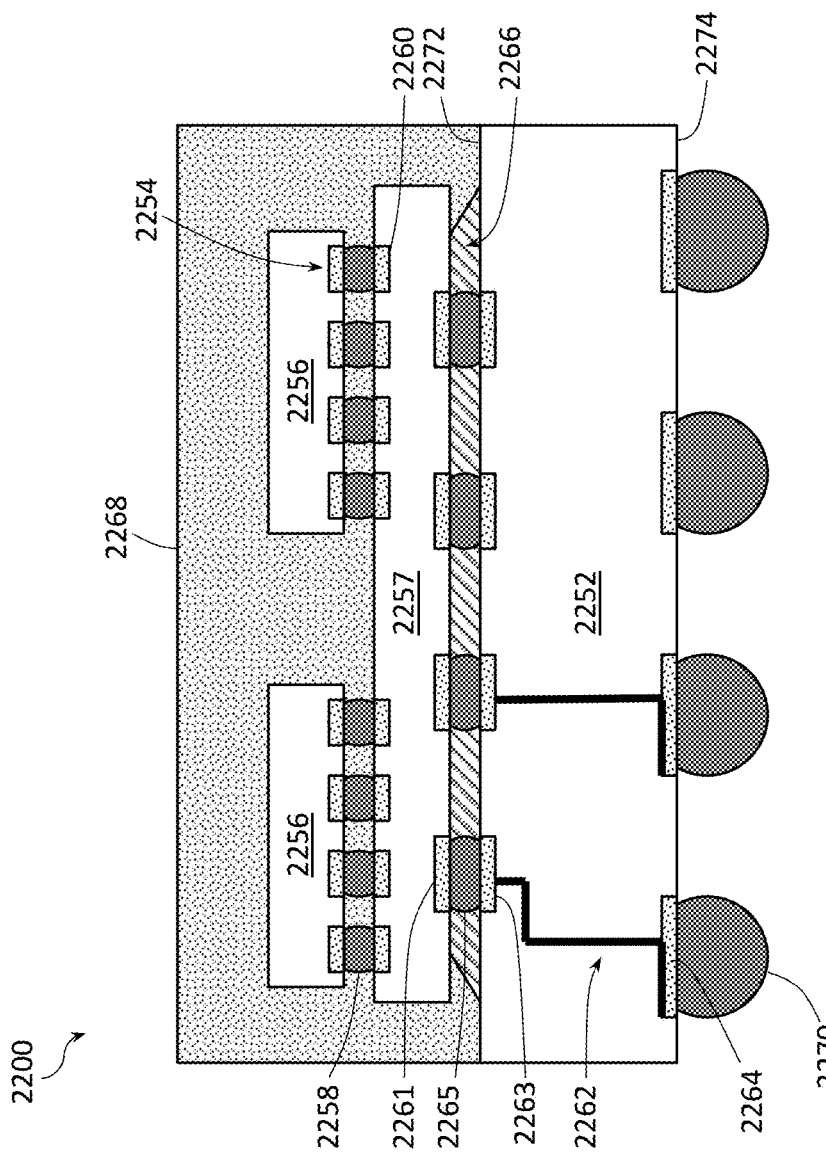
FIG. 11 is a cross-sectional side view of an IC package that may include an IC assembly with back-side power delivery and glass support at the front in accordance with any of the embodiments disclosed herein.
Figure 12:
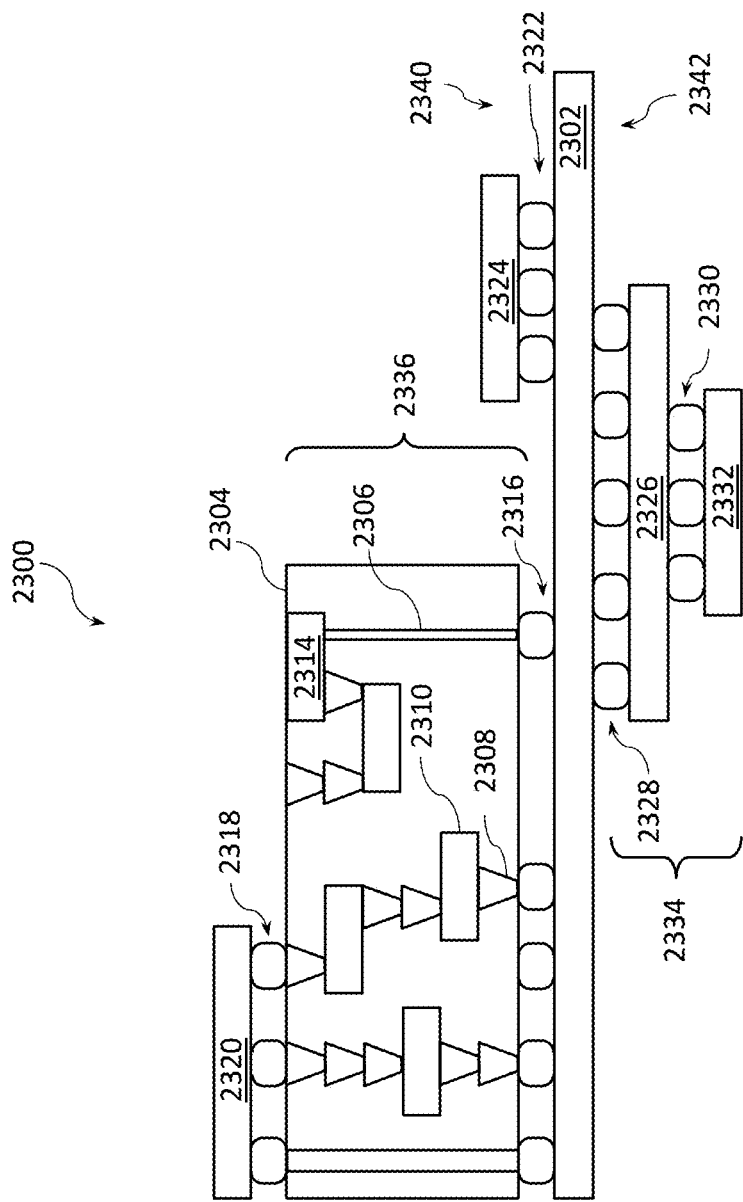
FIG. 12 is a cross-sectional side view of an IC device assembly that may include an IC assembly with back-side power delivery and glass support at the front in accordance with any of the embodiments disclosed herein.
Figure 13:
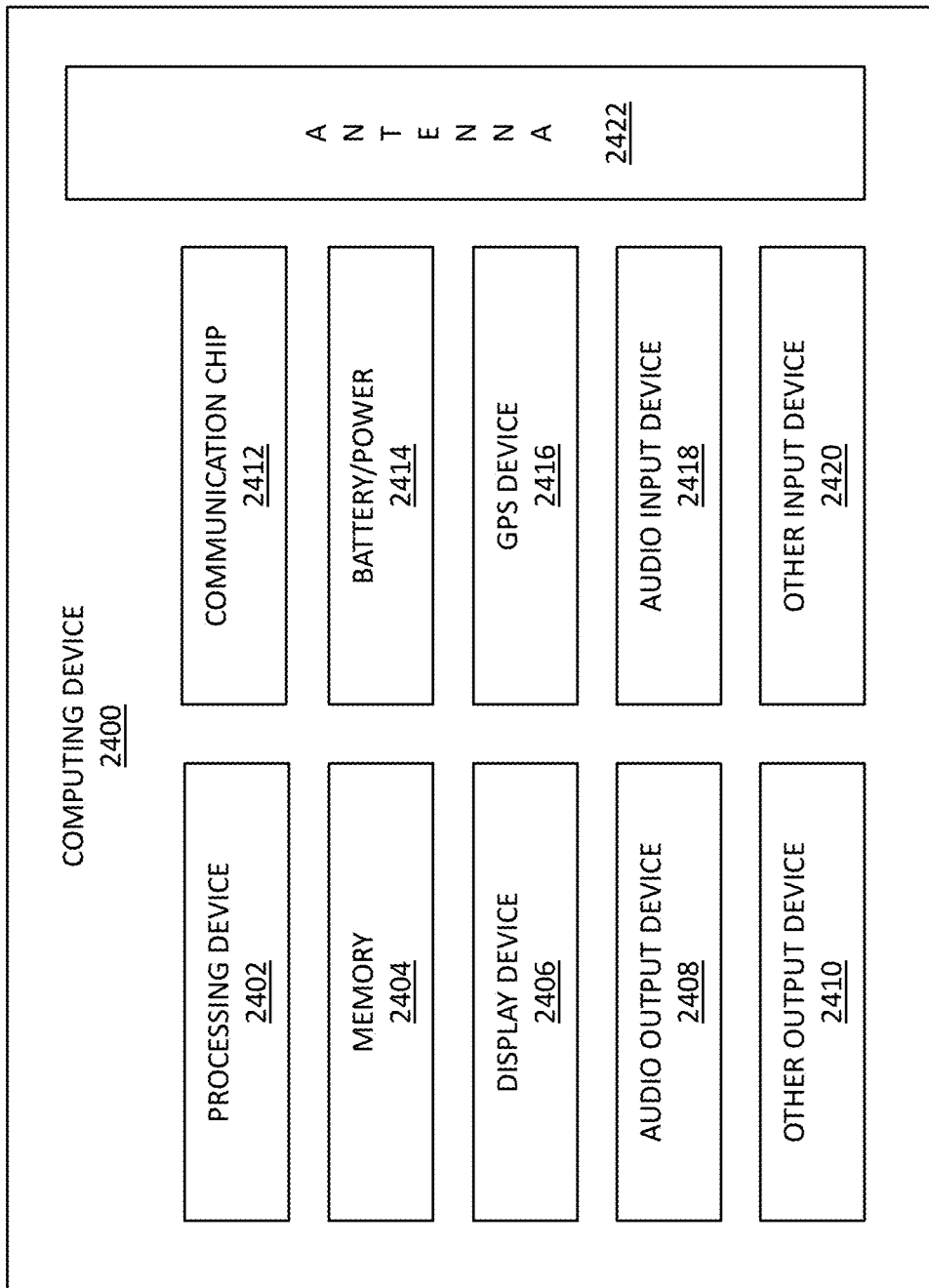
FIG. 13 is a block diagram of an example computing device that may include an IC assembly with back-side power delivery and glass support at the front in accordance with any of the embodiments disclosed herein.

IC assemblies with back-side power delivery and glass support at the front as disclosed herein may be included in any suitable electronic device. FIGS. 11-13 illustrate various examples of devices and components that may include one or more IC assemblies with back-side power delivery and glass support at the front as disclosed herein.

FIG. 11 is a side, cross-sectional view of an example IC package 2200 that may include one or more IC assemblies with back-side power delivery and glass support at the front in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 13 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 11 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 11 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 12.

The dies 2256 may take the form of any of the embodiments of the IC assemblies with back-side power delivery and glass support at the front discussed herein. In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded logic and memory devices as described herein. In some embodiments, any of the dies 2256 may include one or more IC assemblies with back-side power delivery and glass support at the front, e.g., as discussed above; in some embodiments, at least some of the dies 2256 may not include any of the IC assemblies with back-side power delivery and glass support at the front.

The IC package 2200 illustrated in FIG. 11 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 11, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

FIG. 12 is a cross-sectional side view of an IC device assembly 2300 that may include components having one or more IC assemblies with back-side power delivery and glass support at the front in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC assemblies with back-side power delivery and glass support at the front in accordance with any of the embodiments disclosed herein; e.g., any of the IC packages discussed below with reference to the IC device assembly 2300 may take the form of any of the embodiments of the IC package 2200 discussed above with reference to FIG. 11 (e.g., may include one or more IC assemblies with back-side power delivery and glass support at the front provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 12 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 12), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 include one or more IC assemblies with back-side power delivery and glass support at the front as described herein. Although a single IC package 2320 is shown in FIG. 12, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 12, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 12 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

FIG. 13 is a block diagram of an example computing device 2400 that may include one or more components with one or more IC assemblies with back-side power delivery and glass support at the front in accordance with any of the embodiments disclosed herein. Any of the components of the computing device 2400 may include an IC package 2200 as described with reference to FIG. 11. Any of the components of the computing device 2400 may include an IC device assembly 2300 as described with reference to FIG. 12.

A number of components are illustrated in FIG. 13 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 13, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include one or more IC assemblies with back-side power delivery and glass support at the front as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 602.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 602.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC assembly that includes an FEOL layer with a plurality of FEOL devices, a back-side power delivery structure with a plurality of power interconnects electrically coupled to (e.g., in electrically conductive contact with at least portions of) various ones of the plurality of FEOL devices, a BEOL layer with a plurality of BEOL interconnects electrically coupled to (e.g., in electrically conductive contact with at least portions of) one or more of the plurality of FEOL devices, and a glass support structure (e.g., at least a portion of a glass wafer), where the FEOL layer is between the back-side power delivery structure and the BEOL layer, and the BEOL layer is between the FEOL layer and the glass support structure.

Example 2 provides the IC assembly according to example 1, where the plurality of BEOL interconnects includes a first BEOL interconnect and a second BEOL interconnect (e.g., a first and a second metal lines), and the glass support structure includes a two-terminal thin-film device having a first terminal electrically coupled (e.g., in electrically conductive contact with) to the first BEOL interconnect and having a second terminal electrically coupled (e.g., in electrically conductive contact with) to the second BEOL interconnect.

Example 3 provides the IC assembly according to example 2, where the thin-film device is a thin-film resistor.

Example 4 provides the IC assembly according to example 2, where the thin-film device is a thin-film capacitor.

Example 5 provides the IC assembly according to example 2, where the thin-film device is a thin-film inductor.

Example 6 provides the IC assembly according to any one of the preceding examples, further including a bonding interface between the BEOL layer and the glass support structure.

Example 7 provides the IC assembly according to example 6, where the bonding interface includes an oxide.

Example 8 provides the IC assembly according to example 7, where the oxide includes portions in contact with one or more portions of the glass support structure, and portions in contact with one or more portions of the BEOL layer.

Example 9 provides the IC assembly according to any one of examples 1-7, further including an active layer that includes a plurality of IC devices and interconnects, where the active layer is between the glass support structure and the bonding interface, the bonding interface is between the active layer and the BEOL layer, and at least one of the plurality of IC devices and interconnects of the active layer is electrically coupled to (e.g., in electrically conductive contact with at least portions of) one or more of the plurality of BEOL interconnects.

Example 10 provides the IC assembly according to example 9, where the bonding interface is a hybrid bonding interface.

Example 11 provides the IC assembly according to examples 9 or 10, where the bonding interface includes portions in contact with one or more portions of the active layer, and portions in contact with one or more portions of the BEOL layer.

Example 12 provides the IC assembly according to any one of examples 9-11, where a cross-section of each of at least one interconnect of the active layer and at least one interconnect of the BEOL interconnects is a trapezoid that includes two parallel sides, one of which is a short side and another one of which is a long side, for the trapezoid of the at least one interconnect of the active layer, the short side is closer to the glass support structure than the long side, and for the trapezoid of the at least one interconnect of the BEOL interconnects, the long side is closer to the glass support structure than the short side.

Example 13 provides the IC assembly according to example 12, where a cross-section of at least one interconnect of the power interconnects is a trapezoid that includes two parallel sides, one of which is a short side and another one of which is a long side, and, for the trapezoid of the at least one interconnect of the power interconnects, the short side is closer to the glass support structure than the long side.

Example 14 provides the IC assembly according to any one of the preceding examples, where the plurality of FEOL devices includes a FEOL transistor having a source region and a drain region, and at least one power interconnect of the plurality of power interconnects is electrically coupled to (e.g., in electrically conductive contact with) the source region or the drain region.

Example 15 provides the IC assembly according to any one of the preceding examples, where the back-side power delivery structure includes an insulator material enclosing at least portions of the plurality of power interconnects.

Example 16 provides the IC assembly according to any one of the preceding examples, where the BEOL layer includes one or more memory layers, the one or more memory layers including memory cells including thin-film transistors.

Example 17 provides the IC assembly according to any one of the preceding examples, where the glass support structure is replaced with a support structure of a material having a dielectric constant lower than 10, which may, but does not have to be, glass. For example, the material of the support structure may be mica.

Example 18 provides an IC package that includes an IC assembly according to any one of the preceding examples; and a further IC component, coupled to the IC assembly.

Example 19 provides the IC package according to example 18, where the further IC component includes one of a package substrate, an interposer, or a further IC die.

Example 20 provides the IC package according to examples 18 or 20, where the IC assembly includes, or is a part of, at least one of a memory device, a computing device, a wearable device, a handheld electronic device, and a wireless communications device.

Example 21 provides an electronic device that includes a carrier substrate; and one or more of the IC assembly according to any one of the preceding examples and the IC package according to any one of the preceding examples, coupled to the carrier substrate.

Example 22 provides the electronic device according to example 21, where the carrier substrate is a motherboard.

Example 23 provides the electronic device according to example 21, where the carrier substrate is a PCB.

Example 24 provides the electronic device according to any one of examples 21-23, where the electronic device is a wearable electronic device (e.g., a smart watch) or handheld electronic device (e.g., a mobile phone).

Example 25 provides the electronic device according to any one of examples 21-24, where the electronic device further includes one or more communication chips and an antenna.

Example 26 provides the electronic device according to any one of examples 21-25, where the electronic device is an RF transceiver.

Example 27 provides the electronic device according to any one of examples 21-25, where the electronic device is one of a switch, a power amplifier, a low-noise amplifier, a filter, a filter bank, a duplexer, an upconverter, or a downconverter of an RF communications device, e.g. of an RF transceiver.

Example 28 provides the electronic device according to any one of examples 21-25, where the electronic device is a computing device.

Example 29 provides the electronic device according to any one of examples 21-28, where the electronic device is included in a base station of a wireless communication system.

Example 30 provides the electronic device according to any one of examples 21-28, where the electronic device is included in a user equipment device (i.e., a mobile device) of a wireless communication system.

Example 31 provides a method of fabricating an IC assembly, the method including: providing FEOL devices over a semiconductor support structure; providing a BEOL layer over the FEOL devices, the BEOL layer including a plurality of BEOL interconnects electrically coupled to (e.g., in electrically conductive contact with at least portions of) one or more of the plurality of FEOL devices; bonding an arrangement of the BEOL layer and the FEOL devices to a non-semiconductor support structure; performing a back-side reveal by removing at least portions of the semiconductor support structure to expose portions of the FEOL devices; and providing a back-side power delivery structure, including a plurality of power interconnects electrically coupled to (e.g., in electrically conductive contact with at least portions of) the exposed portions of the FEOL devices.

Example 32 provides the method according to example 31, where bonding the arrangement of the BEOL layer and the FEOL devices to the non-semiconductor support structure includes providing one or more bonding materials on at least one of a face of the BEOL layer to be bonded to the non-semiconductor support structure and a face of the non-semiconductor support structure to be bonded to the BEOL layer, and attaching the face of the BEOL layer to be bonded to the non-semiconductor support structure to the face of the non-semiconductor support structure to be bonded to the BEOL layer.

Example 33 provides the method according to example 32, where the one or more bonding materials include an oxide.

Example 34 provides the method according to any one of examples 31-33, where removing the at least portions of the semiconductor support structure to expose the portions of the FEOL devices includes polishing or grinding away the semiconductor support structure until the portions of the FEOL devices are exposed.

Example 35 provides the method according to any one of examples 31-34, where the at least portions of the semiconductor support structure are removed after bonding the arrangement of the BEOL layer and the FEOL devices to the non-semiconductor support structure.

Example 36 provides the method according to any one of examples 31-35, where the back-side power delivery structure includes an insulator material enclosing at least portions of the plurality of power interconnects.

Example 37 provides the method according to any one of examples 31-36, where the non-semiconductor support structure includes glass.

Example 38 provides the method according to any one of examples 31-37, where the non-semiconductor support structure includes mica.

Example 39 provides the method according to any one of examples 31-37, where the non-semiconductor support structure includes an active layer that includes a plurality of IC devices and interconnects, and bonding the arrangement of the BEOL layer and the FEOL devices to the non-semiconductor support structure includes bonding the arrangement of the BEOL layer and the FEOL devices to the active layer to electrically couple at least one of the plurality of IC devices and interconnects of the active layer and one or more of the plurality of BEOL interconnects.

Example 40 provides the method according to any one of examples 31-39, further including processes for forming the IC assembly according to any one of the preceding examples (e.g., for forming the IC assembly according to any one of examples 1-17).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) assembly, comprising:
    a front end of line (FEOL) layer, comprising a plurality of FEOL devices;
    a back-side power delivery structure, comprising a plurality of power interconnects coupled to various of the plurality of FEOL devices;
    a back end of line (BEOL) layer, comprising a plurality of BEOL interconnects coupled to one or more of the plurality of FEOL devices, wherein the plurality of BEOL interconnects includes a first BEOL interconnect and a second BEOL interconnect;
a glass support structure comprising a thin-film device having a first terminal coupled to the first BEOL interconnect and having a second terminal coupled to the second BEOL interconnect; and
a bonding interface between the BEOL layer and the glass support structure,
wherein:
the FEOL layer is between the back-side power delivery structure and the BEOL layer,
the BEOL layer is between the FEOL layer and the glass support structure, and
at least a portion of the thin-film device extends through the bonding interface.

2. The IC assembly according to claim 1, wherein the thin-film device is one of a resistor, a capacitor, or an inductor.

3. The IC assembly according to claim 1, wherein the bonding interface includes oxygen.

4. The IC assembly according to claim 1, wherein:
the plurality of FEOL devices includes a FEOL transistor having a source region and a drain region, and
at least one power interconnect of the plurality of power interconnects is coupled to the source region or the drain region.

5. The IC assembly according to claim 1, wherein the back-side power delivery structure includes an insulator material enclosing at least portions of the plurality of power interconnects.

6. The IC assembly according to claim 1, wherein the BEOL layer includes one or more memory layers, the one or more memory layers including memory cells comprising thin-film transistors.

7. The IC assembly according to claim 1, further comprising:
a conductive interconnect extending through the bonding interface,
wherein the first terminal of the thin-film device is coupled to the first BEOL interconnect via the conductive interconnect.

8. The IC assembly according to claim 1, wherein the bonding interface is a hybrid bonding interface.

9. The IC assembly according to claim 1, further comprising a layer that includes a plurality of IC devices and interconnects, wherein:
the layer is between the glass support structure and the bonding interface,
the bonding interface is between the layer and the BEOL layer, and
at least one of the plurality of IC devices and interconnects of the layer is coupled to one or more of the plurality of BEOL interconnects.

10. The IC assembly according to claim 9, wherein the bonding interface includes:
portions in contact with one or more portions of the layer, and
portions in contact with one or more portions of the BEOL layer.

11. The IC assembly according to claim 9, wherein:
a cross-section of each of at least one interconnect of the layer and at least one interconnect of the BEOL interconnects is substantially a trapezoid that includes two parallel sides, one of which is a short side and another one of which is a long side,
for the trapezoid of the at least one interconnect of the layer, the short side is closer to the glass support structure than the long side, and
for the trapezoid of the at least one interconnect of the BEOL interconnects, the long side is closer to the glass support structure than the short side.

12. The IC assembly according to claim 11, wherein:
a cross-section of at least one interconnect of the power interconnects is a trapezoid that includes two parallel sides, one of which is a short side and another one of which is a long side, and
for the trapezoid of the at least one interconnect of the power interconnects, the short side is closer to the glass support structure than the long side.

13. An integrated circuit (IC) assembly, comprising:
a first layer, comprising a plurality of transistors;
a power delivery structure, comprising a plurality of power interconnects coupled to at least one of the transistors;
a second layer, comprising a plurality of conductive interconnects coupled to one or more of the plurality of transistors, wherein the first layer is between the power delivery structure and the second layer;
a glass structure comprising a device having a terminal coupled to at least one of the plurality of interconnects; and
a bonding interface between the second layer and the glass structure,
wherein:
the at least one of the plurality of interconnects extends through the bonding interface, or
the terminal of the device is coupled to the at least one of the plurality of interconnects via a conductive interconnect that extends through the bonding interface.

14. The IC assembly according to claim 13, wherein the device is one of a transistor, a memory cell, a resistor, a capacitor, an inductor.

15. The IC assembly according to claim 13, wherein the bonding interface includes oxygen.

16. An integrated circuit (IC) assembly, comprising:
a first layer comprising a plurality of devices, wherein the plurality of devices include transistors or memory cells;
an interconnect structure comprising a plurality of conductive interconnects coupled to one or more of the plurality of devices;
a second layer comprising a first conductive interconnect and a second conductive interconnect;
a glass layer comprising a device having a first terminal coupled to the first conductive interconnect and having a second terminal coupled to the second conductive interconnect;
a bonding interface between the second layer and the glass layer; and
a third conductive interconnect extending through the bonding interface,
wherein:
the first layer is between the interconnect structure and the second layer,
the second layer is between the first layer and the glass layer, and
the first terminal of the device is coupled to the first conductive interconnect via the third conductive interconnect.

17. The IC assembly according to claim 16, wherein at least a portion of the device extends through the bonding interface.

18. The IC assembly according to claim 16, wherein the device is one of a transistor, a memory cell, a resistor, a capacitor, an inductor.

19. The IC assembly according to claim 16, wherein the bonding interface is a hybrid bonding interface.

20. The IC assembly according to claim 16, wherein the bonding interface includes oxygen.

\* \* \* \* \*